(12) United States Patent
Bidermann et al.

(10) Patent No.: US 6,788,237 B1
(45) Date of Patent: **\*Sep. 7, 2004**

(54) ELECTRICALLY AND OPTICALLY SYMMETRICAL ANALOG-TO-DIGITAL CONVERTER FOR DIGITAL PIXEL SENSORS

(75) Inventors: William R. Bidermann, Los Gatos, CA (US); Erlend M. Olson, Duarte, CA (US)

(73) Assignee: Pixim, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/620,580

(22) Filed: Jul. 15, 2003

Related U.S. Application Data

(63) Continuation-in-part of application No. 10/150,553, filed on May 17, 2002, now Pat. No. 6,693,575, which is a continuation-in-part of application No. 09/965,600, filed on Sep. 25, 2001, now Pat. No. 6,518,909, which is a continuation of application No. 09/823,443, filed on Mar. 30, 2001, now Pat. No. 6,310,571.

(51) Int. Cl.[7] .............................................. H30M 1/12
(52) U.S. Cl. ...................... 341/155; 341/159; 341/156
(58) Field of Search ................................ 341/155, 156, 341/159

(56) References Cited

U.S. PATENT DOCUMENTS

| | | | |
|---|---|---|---|
| 4,599,602 A | 7/1986 | Matzuzawa et al. | 340/347 AD |
| 5,126,742 A | 6/1992 | Schmidt et al. | 341/156 |
| 5,307,067 A | 4/1994 | Kimura et al. | 341/159 |
| 5,313,207 A | 5/1994 | Kouno et al. | 341/156 |
| 5,461,425 A | 10/1995 | Fowler et al. | 348/294 |
| 5,684,419 A | 11/1997 | Murden et al. | 327/104 |
| 5,801,657 A | 9/1998 | Fowler et al. | 341/155 |
| 6,310,571 B1 * | 10/2001 | Yang et al. | 341/155 |
| 6,362,767 B1 | 3/2002 | Yang et al. | 341/155 |
| 6,518,909 B1 * | 2/2003 | Yang et al. | 341/155 |

OTHER PUBLICATIONS

Yang et al., A 640×512 CMOS Image Sensor with Ultrawide Dynamic Range Floating–Point Pixel Level ADC, IEEE Journal of Solid–State Circuits, vol. 34, No. 12, Dec. 1999, pp. 1821–1834.

* cited by examiner

*Primary Examiner*—Michael Tokar
*Assistant Examiner*—Lam T. Mai
(74) *Attorney, Agent, or Firm*—Patent Law Group LLP; Carmen C. Cook

(57) ABSTRACT

A circuit includes an analog-to-digital (A/D) converter for multiplexing between a number of analog input signals and converting the selected analog input signals to a digital code representation. The A/D converter includes a comparator having a first input terminal coupled to receive a first reference signal having a number of levels, a second input terminal coupled to receive a multiple number of analog input signals, and a third input terminal for receiving a multiple number of input select signals. The comparator includes a multiplexor coupling the multiple number of analog input signals to a multiple number of corresponding differential pairs. The multiplexor selects one of the multiple number of differential pairs based on the multiple number of input select signals. In one embodiment, the A/D converter is applied in a digital image sensor for performing pixel-level analog-to-digital conversion using a multi-channel bit serial ADC technique.

34 Claims, 14 Drawing Sheets

ELECTRICALLY AND OPTICALLY SYMMETRICAL ANALOG-TO-DIGITAL CONVERTER FOR DIGITAL PIXEL SENSORS

CROSS REFERENCE TO RELATED APPLICATION

This application is a continuation-in-part of application Ser. No. 10/150,553, filed May 17, 2002, entitled "Multi-Channel Bit-Serial Analog-to-Digital Converter with Reduced Channel Circuitry," by David Xiao Dong Yang and William R. Biderrnann, now U.S. Pat. No. 6,693,575, issued Feb. 17, 2004, which is a continuation-in-part of U.S. patent application Ser. No. 09/965,600, filed on Sep. 25, 2001, entitled "Analog-to-Digital Converter with Multiplexed Input Channels," by David Xiao Dong Yang and William R. Bidermann, now U.S. Pat. No. 6,518,909, issued Feb. 11, 2003, which is a continuation of application Ser. No. 09/823,443, filed Mar. 30, 2001, entitled "Multiplexed Multi-Channel Bit Serial Analog-to-Digital Converter," by David Xiao Dong Yang and William R. Bidermann, now U.S. Pat. No. 6,310,571, issued Oct. 30, 2001. The aforementioned patents and patent application are incorporated hereby by reference in their entireties.

FIELD OF THE INVENTION

The invention relates to analog-to-digital converters and, in particular, to an analog-to-digital converter coupled to perform analog-to-digital conversion for multiple analog signals.

DESCRIPTION OF THE RELATED ART

A CMOS image sensor with pixel level analog-to-digital conversion is described in U.S. Pat. No. 5,461,425 of B. Fowler et al. ("the '425 patent"), incorporated herein by reference in its entirety. Such an image sensor, referred to as a digital pixel sensor (DPS), provides a digital output signal at each pixel element representing the light intensity detected by that pixel element. The combination of a photodetector and an analog-to-digital (A/D) converter in an area image sensor helps enhance detection accuracy and reduce power consumption, and improves overall system performance.

FIG. 1 duplicates FIG. 1 of the '425 patent and is a block diagram of a digital image sensor 10 as disclosed in the '425 patent. As is shown, digital image sensor 10 includes an image sensor core 12 which has a two-dimensional array of pixels. Each pixel 15 of sensor core 12 has a light detecting element (a photodetector or photosensor) coupled to a dedicated A/D converter. Each of the A/D converter outputs a stream of bits representative of the analog output of the associated light detecting element. In other words, the image sensor of the '425 patent outputs digital image data directly from each pixel. In a digital image sensor such as sensor 10 of FIG. 1, not only does the supporting circuitry for image sensor core 12 become dramatically simplified, there are also numerous advantages provided by the digital image sensor architecture in view of traditional CMOS image sensors. The advantages include better control of operations of the image sensor and far better image quality therefrom.

In the DPS array of the '425 patent, the analog-to-digital conversion (ADC) is based on first order sigma delta modulation. While this ADC approach requires fairly simple and robust circuits, it has the disadvantages of producing too much data and suffering from poor low light performance.

U.S. Pat. No. 5,801,657 of Fowler et al. ("the '657 patent") provides an alternative ADC mechanism that can significantly improve the overall system performance while minimizing the size of the A/D converters. The '657 patent is incorporated herein by reference in its entirety.

The '657 patent discloses a multi-channel bit-serial (MCBS) analog-to-digital conversion scheme where bit-serial analog-to-digital conversion can be carried out for a potentially very large number of analog signals simultaneously. Therefore, the MCBS ADC scheme is suitable for use in pixel level ADC in a digital pixel sensor because a large number of pixel signal values need to be converted at the same time. FIG. 2 replicates FIG. 1A of the '657 patent and illustrates the basic architecture of the MCBS ADC technique. In FIG. 2, A/D converter 14 can support a multiple number of input channels, such as Channel 0 to Channel N, where each input channel is associated with an analog input signal In0 to InN. Each input channel contains an 1-bit comparator 16a–n and a 1-bit latch 17a–n. Comparators 16a–n and latches 17a–n are controlled by external control signals RAMP and BITX. The two control signals are generated by a micro-controller 18 and a digital-to-analog (D/A) converter 19 and are broadcasted to all input channels, Channel 0 to Channel N.

The MCBS ADC scheme of the '657 patent provides several advantages. First, because all input channels are operated simultaneously, maximum throughput can be achieved. Second, because each input channel uses simple circuitry, i.e. each input channel includes only one 1-bit comparator and one 1-bit latch, the A/D converter consumes minimum circuit area in implementation. Furthermore, because the more complicated control circuitry, such as micro-controller 18, are shared among all input channels, the overhead of the control circuitry is spread among all of the input channels. These advantages make MCBS A/D converter suitable for use in digitizing systems with a very large number of input channels, such as a digital image sensor with pixel-level A/D converters.

In the digital image sensor of FIG. 1, each pixel element includes a dedicated A/D converter. However, adding a dedicated A/D converter to each of the light detecting elements in an image sensor could introduce some practical problems limiting the practical application of such digital image sensors. One of the problems is that image sensor core 12 is inevitably larger than it would be without the dedicated A/D converters. If an image sensor is desired to have millions of photodetectors thereon, there would be a large number of dedicated A/D converters, which could take a significant amount of circuit area to implement in the image sensor core. Larger image sensor cores are undesirable because they typically lead to higher manufacturing cost and lower yield.

The '657 patent proposes an alternative sensor array architecture where an A/D converter is shared among a group of neighboring pixel elements. FIG. 3 is a block diagram of a digital image sensor where an A/D converter is associated with four photodetectors in an image sensor array. In digital image sensor 20 of FIG. 3, sensor array 22 includes a two-dimensional array of photodetectors 24. Instead of providing a dedicated ADC circuit to each photodetector, an ADC circuit 26 is shared among a group of four neighboring photodetectors 24. Each of the ADC circuit 26 performs A/D conversion of the output voltage signal by multiplexing between the four neighboring photodetectors. Although the image capture time becomes four times longer in the shared-ADC architecture of FIG. 3 than the dedicated-ADC architecture of FIG. 1, the shared-ADC architecture of FIG. 3 has the advantage of retaining all of the benefit of pixel level analog-to-digital conversion while using a much smaller circuit area, thus reducing manufacturing cost and improving yield. The shared-ADC architecture is also described in "A 640×512 CMOS Image Sensor with Ultrawide Dynamic Range Floating-Point Pixel-Level ADC," by David X. D. Yang et al., IEEE Journal of Solid-State Circuits, Vol. 34, No. 12, December 1999, p. 1821–1834, which reference is incorporated by reference in its entirety.

The '657 patent describes various schemes for multiplexing the four neighboring pixel elements to the associated A/D converter. FIG. 4 is a block diagram illustrating a multiplexing scheme described in the '657 patent. In FIG. 4, four pixel elements, illustrated as photodiodes D0 to D3, are multiplexed onto a single input terminal Inm of comparator 16 through four NMOS transistors 31–34 functioning as switches. The control terminals (or gate terminals) of transistors 31–34 are coupled to select signals S0 to S3. At any one time, only one of the select signals S0 to S3 will go high to cause one of NMOS transistors 31 to 34 to turn on, thus coupling the analog pixel charge voltage at the respective photodiode to the input terminal Inm of comparator 16.

The multiplexing scheme of FIG. 4 has several disadvantages. First, this multiplexing scheme makes implementation of multiple sampling very difficult. Multiple sampling is an image capture technique capable of achieving a wide dynamic range without many of the disadvantages associated with other dynamic range enhancement techniques, such as degradation in signal-to-noise ratio and increased implementation complexity. Copending and commonly assigned U.S. patent application Ser. No. 09/567,786, entitled "Multiple Sampling via a Time-indexed Method to Achieve Wide Dynamic Ranges" of David Yang et al., describes a method for facilitating image multiple sampling using a time-indexed approach. Multiple sampling operation involves performing multiple reads from the sensor array over time and then normalizing the readout values based on the multiple sampling information. An image based on the normalized pixel data can be created with a simulated sensitivity range much greater than the actual sensitivity range of the sensor elements. However, it is difficult to apply multiple sampling to an image sensor implementing a shared-ADC architecture using the multiplexing scheme shown in FIG. 4. This is because the multiplexing scheme in FIG. 4 results in cross-talk between the four neighboring photodiodes D0 to D3 such that pixel intensity values recorded by the four photodiodes can be rendered useless. For example, at each sampling time, transistors 31 to 34 are turned on in sequence to transfer the charge on the respective photodiode to the input terminal Inm. Because the voltages at the photodiodes are not reset between each sampling of an image and because each photodiode is sampled onto the same input node, a large cross-talk among the different photodiodes D0 to D3 exists, destroying all meaningful pixel signal values.

Another disadvantage associated with the use of the multiplexing scheme of FIG. 4 is that transistors 31–34 must be carefully designed to avoid introducing noise and non-linearity into the pixel values. Because transistors 31–34 typically have a large gate voltage swing (e.g. from 0 to 5 volts), a large gate switching feedthrough can result to cause a large offset at the photodiodes which may vary from pixel to pixel, resulting in fixed pattern noise.

Therefore, it is desirable to provide a method for implementing the shared-ADC architecture in a digital pixel sensor while avoiding the aforementioned disadvantages.

SUMMARY OF THE INVENTION

In accordance with one embodiment of the present invention, an analog-to-digital (A/D) converter circuit for converting each of a multiple number of analog input signals to a multiple number of corresponding digital values includes a comparator having a first input terminal coupled to receive a first reference signal, a second input terminal coupled to receive the multiple number of analog input signals, a third input terminal for receiving a multiple number of input select signals, and an output terminal providing an output signal. The comparator includes a multiplexor coupled to a multiple number of differential pairs where each differential pair is coupled to a respective one of the multiple number of analog input signals. The multiplexor selects one of the multiple number of differential pairs based on the multiple number of input select signals. In operation, the comparator compares the first reference signal with a selected one of the multiple number of analog input signals to generate the output signal indicative of one or more bits of an N-bit digital code representing the selected one of the multiple number of analog input signals.

In accordance with another embodiment of the present invention, an analog-to-digital (A/D) converter circuit multiplexes between a number of analog input signals and converting the selected analog input signals to a digital code representation. The A/D converter includes a comparator having a first input terminal coupled to receive a first signal having a multiple number of levels. The comparator has a second input terminal coupled to receive a multiple number of analog input signals, and a third input terminal for receiving a multiple number of input select signals. Furthermore, the comparator includes a multiplexor coupling the multiple number of analog input signals to a multiple number of corresponding differential pairs. The multiplexor selects one of the multiple number of differential pairs based on the multiple number of input select signals. The A/D converter further includes a binary signal generator for generating a series of binary signals, and a latch having a first input terminal coupled to receive an output signal of the comparator. The latch has a data input terminal coupled to receive the series of binary signals. An output signal of the comparator controls when the latch provides an output signal corresponding to a binary signal applied to the data input terminal. In operation, the latch provides one or more bits of an N-bit digital code representing at least one of the analog input signals applied to the second input terminal of the comparator.

In one embodiment, the A/D converter is applied in a digital image sensor for performing pixel-level analog-to-digital conversion using a multi-channel bit serial ADC technique. The A/D converter can be applied in a shared-ADC architecture while still permitting the digital image sensor to practice multiple sampling for enhancing the dynamic range of the image sensor.

The present invention is better understood upon consideration of the detailed description below and the accompanying drawings.

BRIEF DESCRIPTION OF THE DRAWINGS

In the present disclosure, like objects which appear in more than one figure are provided with like reference numerals.

DETAILED DESCRIPTION OF THE PREFERRED EMBODIMENTS

According to the present invention, a multiplexed multi-channel bit serial (MCBS) analog-to-digital (A/D) converter performs analog-to-digital conversion of two or more analog input signals by coupling the analog input signals to corresponding input signal paths in a comparator of the A/D converter and multiplexing the input signal paths. By using the multiplexing scheme of the present invention, multiple analog input signals can be digitized using the same A/D converter without the damaging effect of cross-talks between the analog input signals or the introduction of noise in the analog values. The multiplexing scheme of the present invention can be applied in a digital pixel sensor for implementing the shared-ADC architecture where one A/D converter is shared among a number of neighboring pixel elements.

Figure 5:
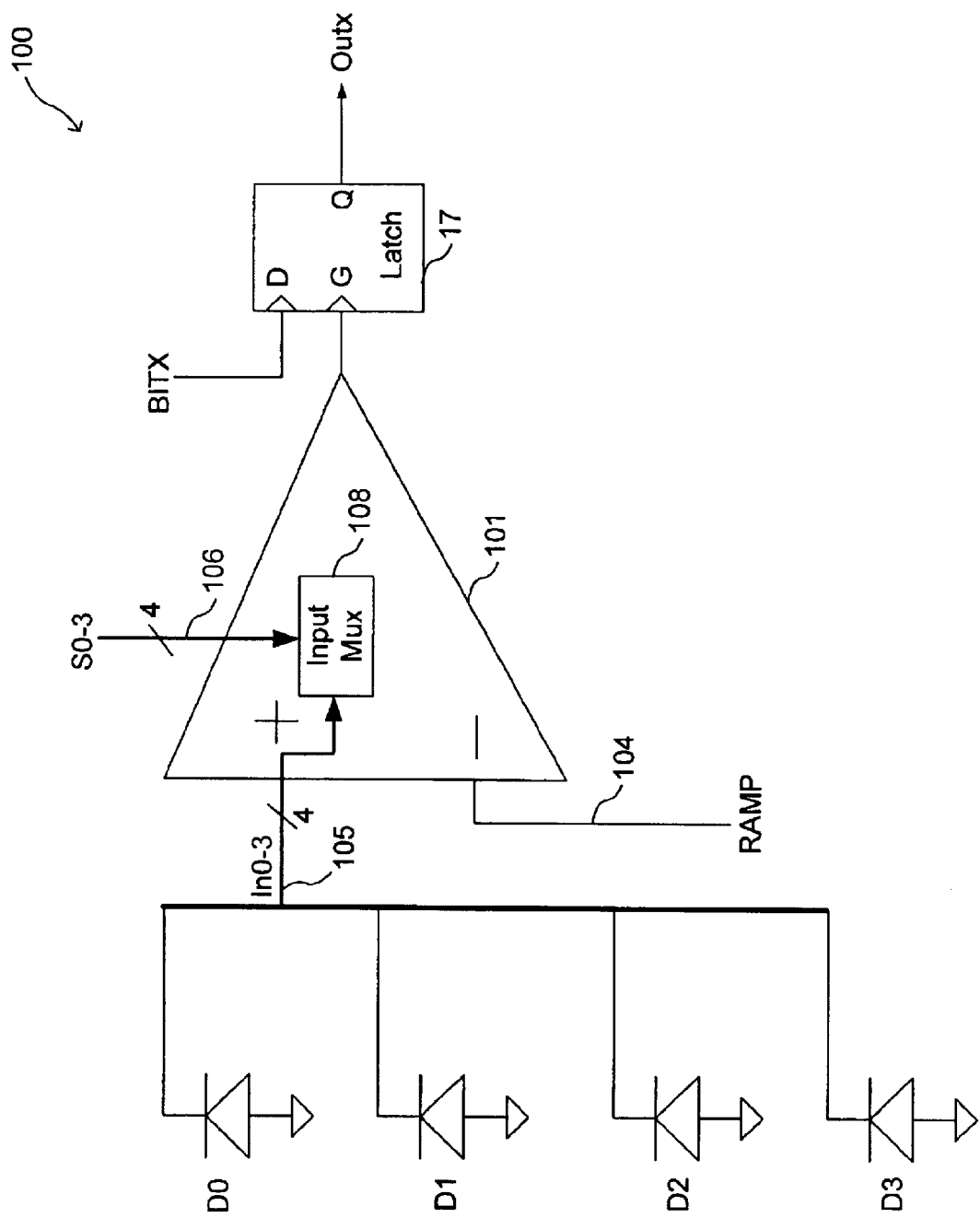
FIG. 5 is a block diagram of an A/D converter according to one embodiment of the present invention.

FIG. 5 is a block diagram of an A/D converter according to one embodiment of the present invention. In the following description, like elements appearing in more than one figure are given like reference numerals to simplify the description. In FIG. 5, A/D converter 100 is coupled to multiplex between four analog signals In0–3 generated by photodiodes D0 to D3 and perform MCBS analog-to-digital conversion of the four analog signals as selected. A/D converter 100 generates an output signal Outx representing an N-bit digital code associated with the selected analog signals where N can be any integer including one (1). Although in the present description, A/D converter 100 is described as being applied in a digital image sensor for performing pixel level ADC, one of ordinary skill in the art would appreciate that A/D converter 100 can be used in other applications for multiplexing between a number of analog signals of any types and digitizing each of the analog signals as selected. Furthermore, while A/D converter 100 is illustrated as multiplexing between four analog signals, one of ordinary skill in the art would appreciate that A/D converter 100 can be used to multiplex between any number of analog signals based on individual design choice.

In accordance with the present invention, A/D converter 100 implements the multi-channel bit-serial (MCBS) analog-to-digital conversion technique described in the aforementioned '657 patent. In the embodiment shown in FIG. 5, A/D converter 100 is illustrated with only one input channel including a 1-bit comparator 101 and a latch 17. Of course, this is illustrative only and A/D converter 100 can be configured to include a multiple number of input channels, each channel disposed to multiplex between a multiple number of analog input signals. Furthermore, A/D converter 100 includes global control circuitry (not shown) for generating the RAMP signal and the BITX signal in the same manner as described in the '657 patent. A/D converter 100 operates to digitize a selected one of the analog input signals In0–3 using the MCBS ADC technique in the same manner as described in the '657 patent.

Comparator 101 of A/D converter 100 includes a negative input terminal 104 coupled to receive the RAMP signal and a positive input terminal 105 coupled to receive analog input signals In0–3. Comparator 101 also includes a select input terminal 106 for receiving input select signals S0–3. Input select signals S0–3 are used to control an input multiplexer 108 (or multiplexor 108) in comparator 101 for selecting one of the four analog input signals In0–3 received on the positive input terminal for analog-to-digital conversion. As will be explained in more detail below, input multiplexer 108 operates to multiplex between analog input signals In0–3 while preventing cross-talk between the analog input signals. Thus, A/D converter 100, incorporating comparator 101, can be shared among a multiple number of analog input signals while preserving the signal integrity of each of the analog input signals.

Figure 1:
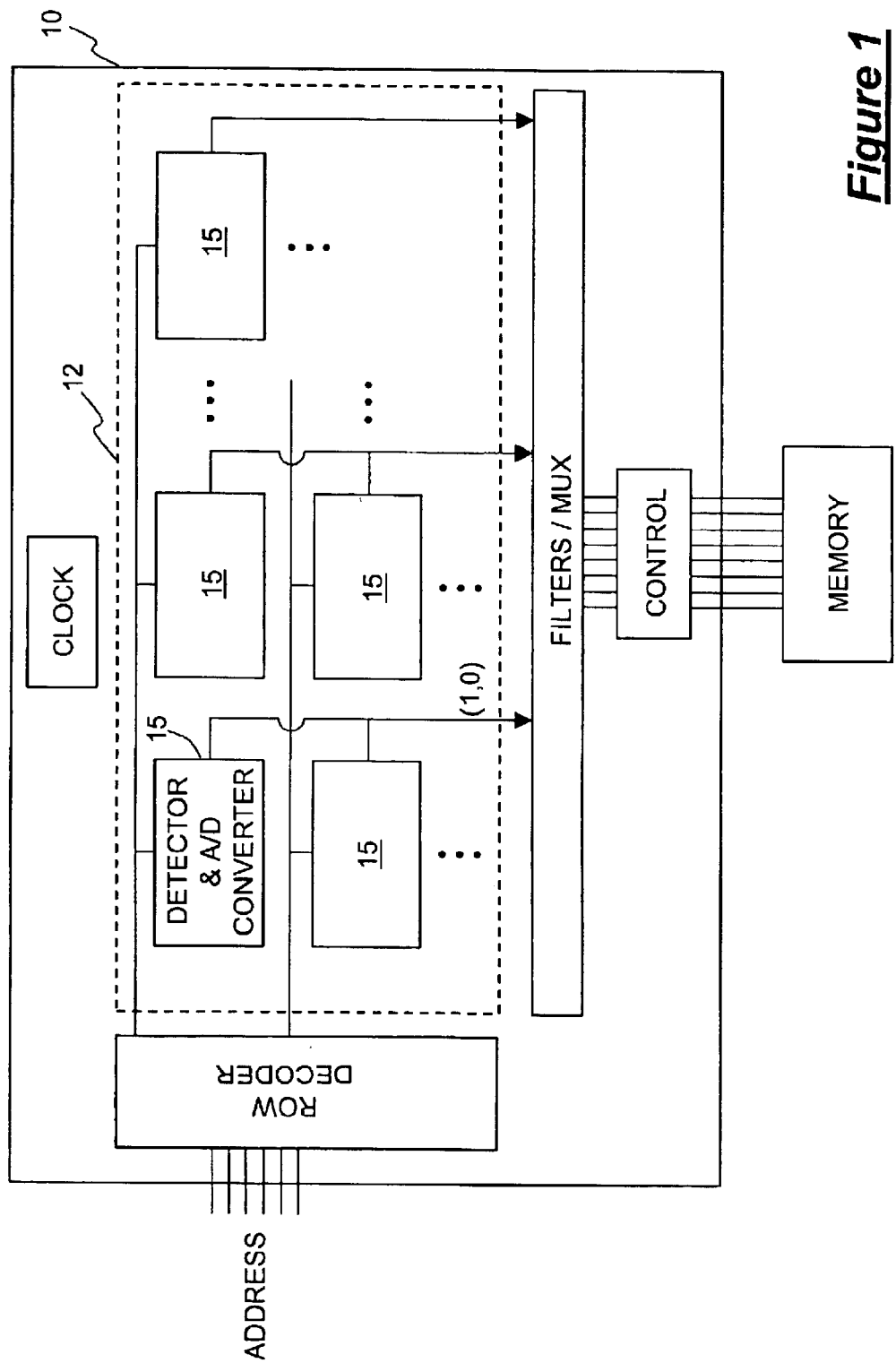
FIG. 1 is a block diagram of a digital image sensor as disclosed in the '425 patent.
Figure 2:
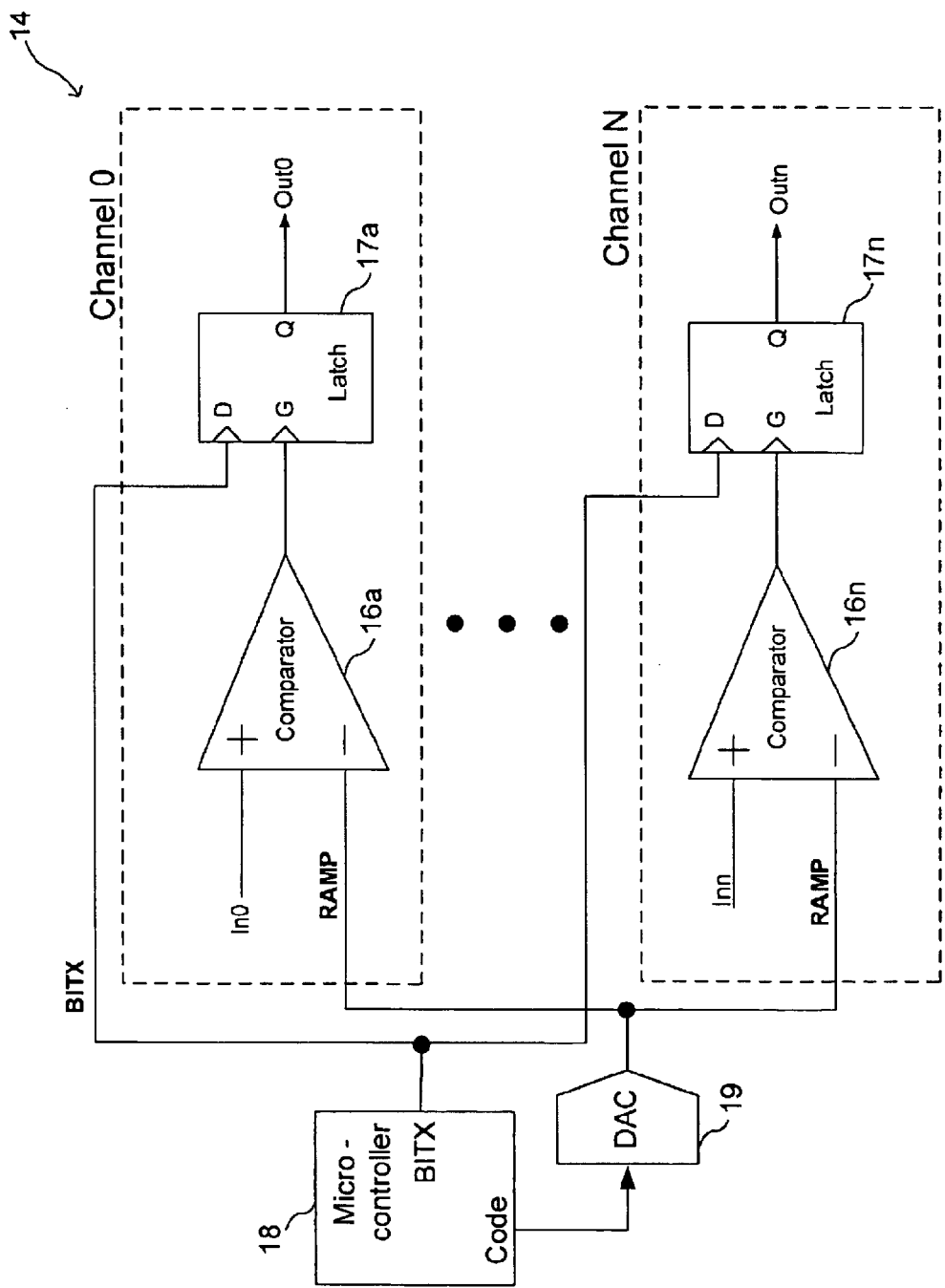
FIG. 2 illustrates the basic architecture of the MCBS ADC technique as disclosed in the '657 patent.
Figure 4:
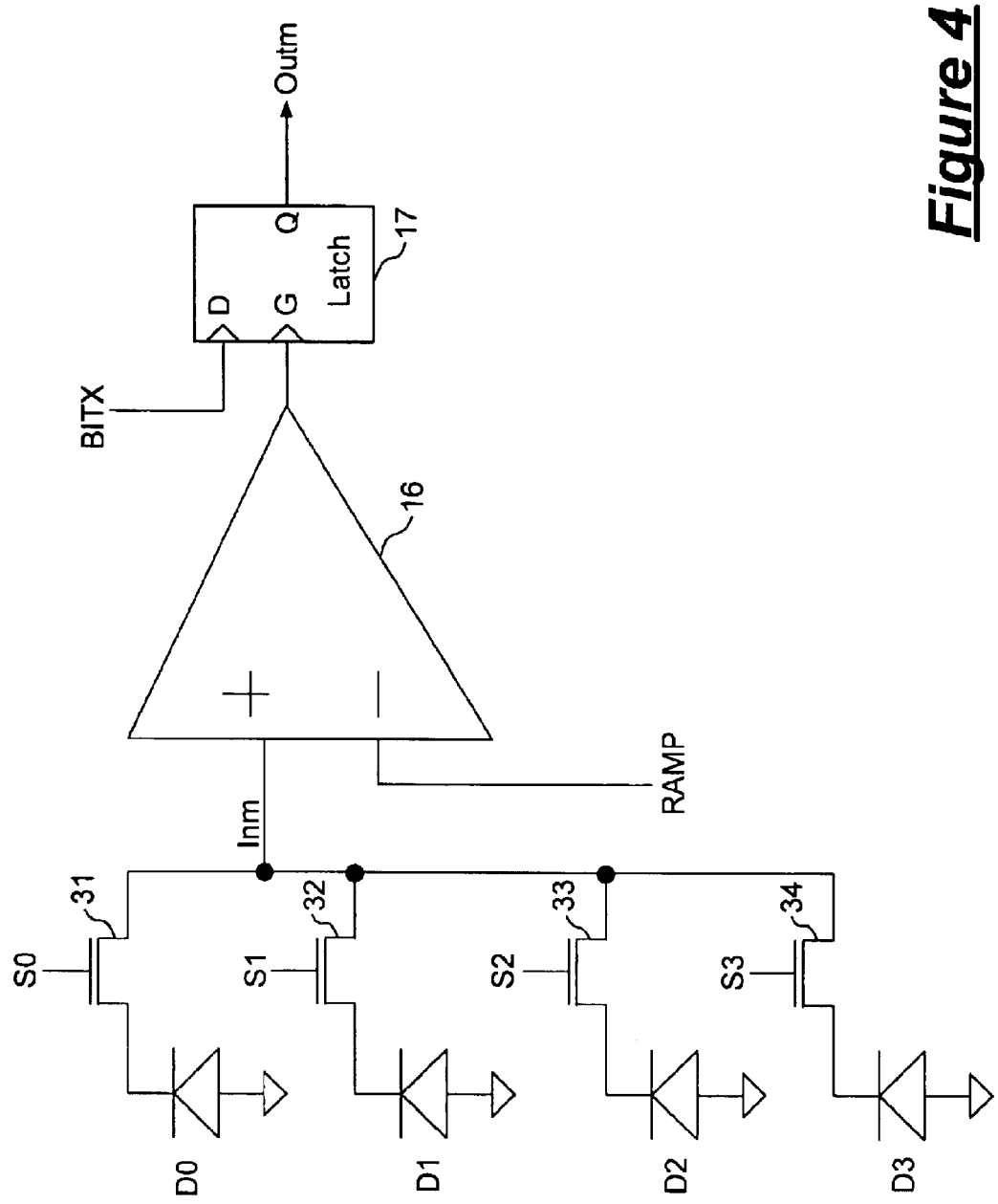
FIG. 4 is a block diagram illustrating a multiplexing scheme described in the '657 patent.
Figure 6:
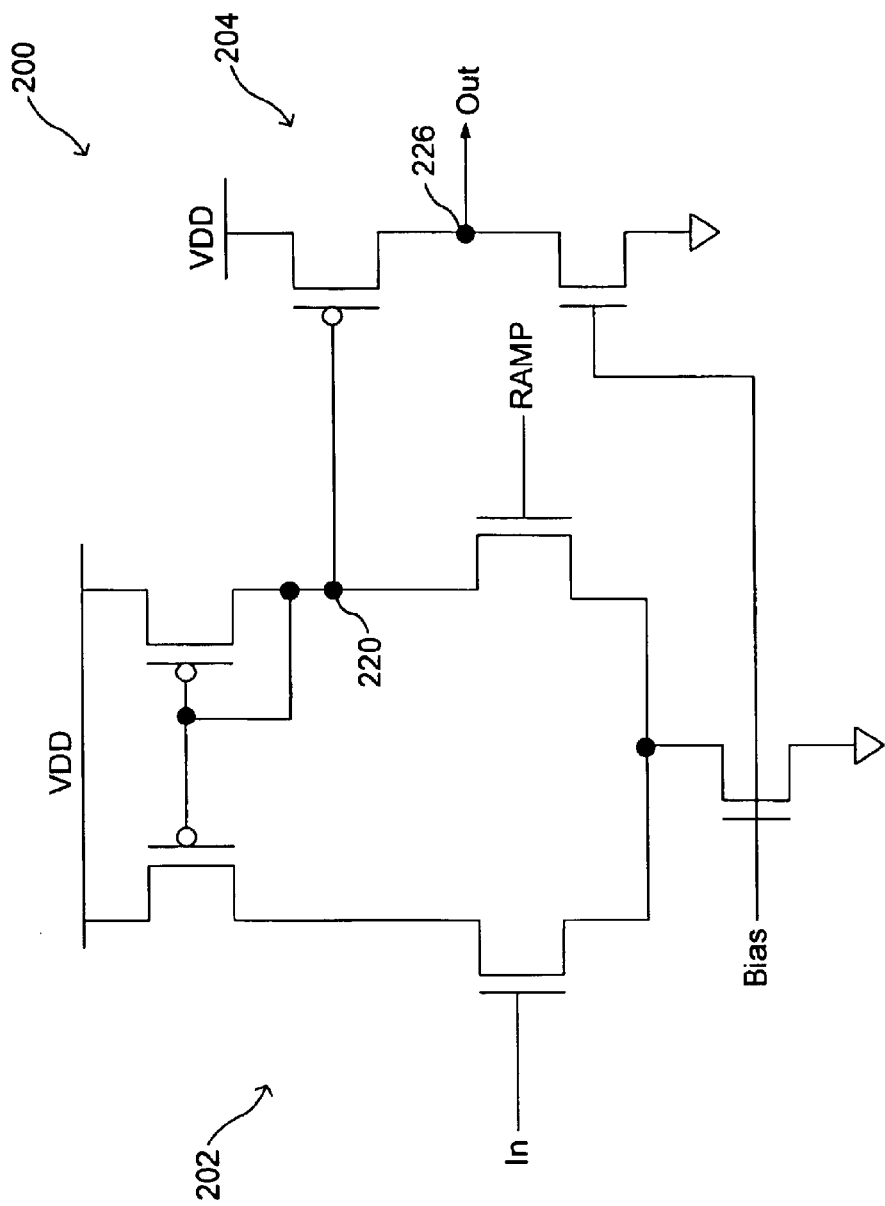
FIG. 6 is a circuit diagram of an exemplary implementation of an 1-bit comparator of FIGS. 2 and 4.

Referring to FIGS. 2 and 4, the 1-bit comparator in the '657 patent is typically implemented using a classic two-stage Op Amp/comparator configuration. An exemplary implementation of the 1-bit comparator is shown in FIG. 6. The first stage of comparator 200 includes a differential pair 202, a current mirror and a bias transistor controlled by a Bias voltage providing a reference current. Differential pair 202 includes a pair of NMOS transistors for receiving the two input signals In and RAMP for comparison. Differential pair 202 provides an output signal at an output node 220 representative of the difference between the analog input signal In and the RAMP signal. In the second stage, comparator 200 includes an inverter 204 for inverting and amplifying the output signal from differential pair 202 and generating a comparison result (signal Out) at node 226. The operation of comparator 200 is well known and a detailed description can be found in the '657 patent. In the multiplexing scheme of FIG. 4, transistors 31 to 34 operate to switch one of the four analog input signals onto the input terminal In of comparator 200. As discussed above, the multiplexing scheme of FIG. 4 permits cross-talk to occur between the analog input signals, thus degrading or destroying the signal levels. In accordance with the present invention, comparator 101 incorporates a novel multiplexing scheme to enable A/D converter 100 to multiplex between multiple number of analog input signals without the adverse effect of cross-talk between the signals. As will be described in more detail below, comparator 101 includes multiplexer 108 for multiplexing the input signal paths in the comparator so that cross-talk between signals are eliminated and comparator 101 can be used to multiplex any number of analog input signals without degrading or destroying the signal integrity.

Figure 7:
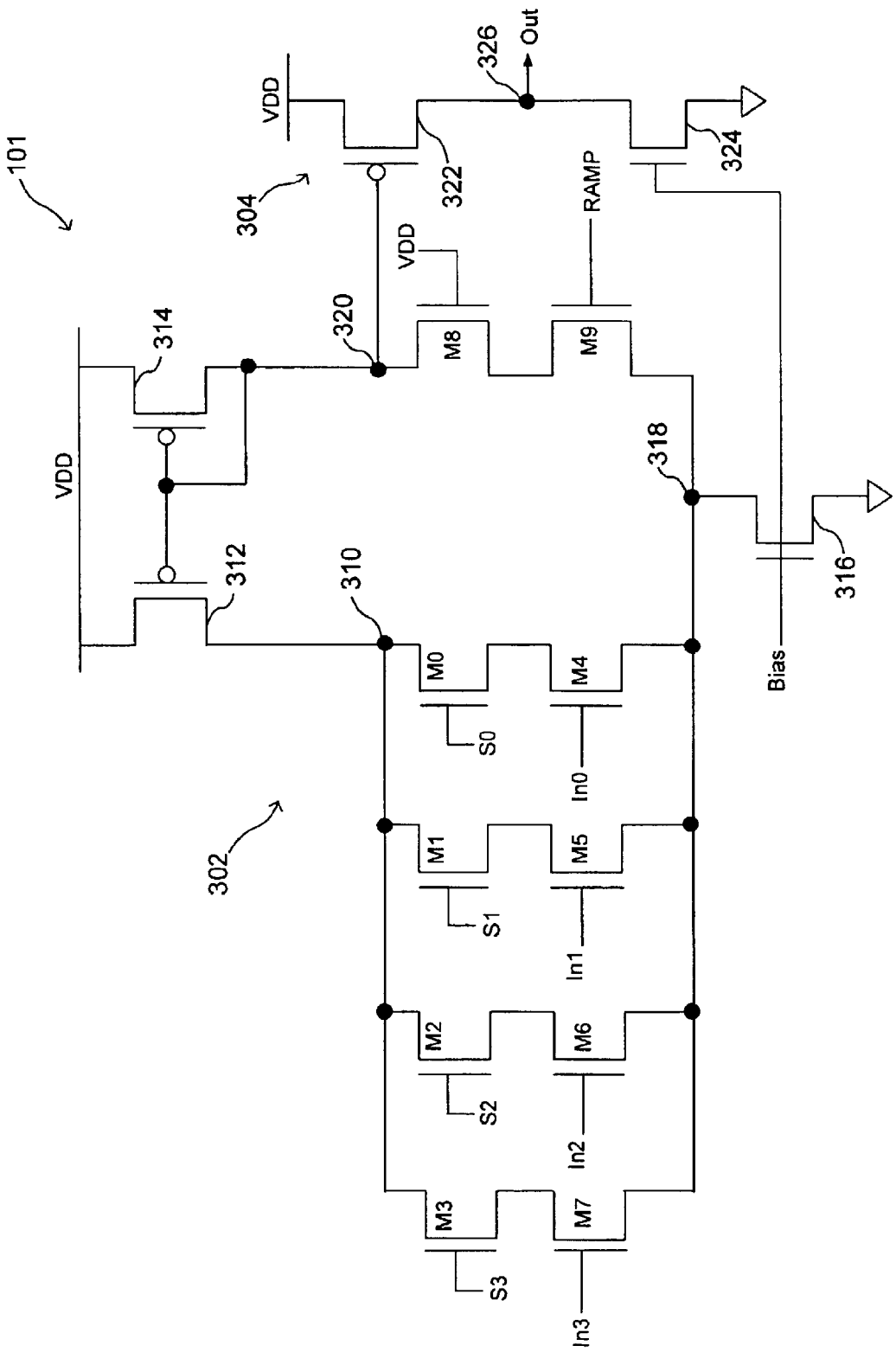
FIG. 7 is a circuit diagram illustrating one embodiment of the 1-bit comparator for use in the A/D converter of FIG. 5.

FIG. 7 is a circuit diagram illustrating one implementation of comparator 101 in A/D converter 100 of FIG. 5 according to one embodiment of the present invention. Comparator 101 includes two stages. The first stage includes a differential pair 302, a current mirror formed by PMOS transistors 312 and 314, and a bias transistor 316. Differential pair 302 includes transistors M0 to M7 forming the first branch of the differential pair and transistors M8 and M9 forming the second branch. Transistor 316 is an NMOS transistor coupled between a node 316 and ground and having its gate terminal controlled by a Bias voltage signal. Transistor 316 provides a reference current at node 318. The second stage of comparator 101 includes an inverter 304 formed by serially connected PMOS transistor 322 and NMOS transistor 324.

The first branch of differential pair 302 includes four input signal paths and incorporates multiplexer 108 for selecting one of the four input signal paths for comparison with the RAMP signal received at the second branch of the differential pair. Specifically, transistors M0 to M3, controlled by input select signals S0 to S3, function as multiplexer 108 for enabling one of the four input signal paths. As illustrated in FIG. 7, serially connected transistors M0 and M4 form one input signal path for receiving analog input signal In0, generated by a photodiode (not shown) for example. Similarly, serially connected transistor pairs M1 and MS, M2 and M6, and M3 and M7 form a second, third and fourth input signal paths for receiving analog input signals In1, In2 and In3 respectively. In operation, at any one time, only one of input select signals S0-3 is enabled (at a logic high level) for turning on one of transistors M0 to M3. Then, the analog input signal of the selected input signal path is available at node 310 for comparison with the RAMP signal. In FIG. 5, comparator 101 is illustrated with multiplexer 108 for multiplexing four input signal paths. Of course, comparator 101 can be configured to multiplex between any number of analog input signals by providing the corresponding number of input signal paths.

In the present embodiment, the second branch of differential pair 302 includes a pair of serially connected NMOS transistors M8 and M9. The gate terminal of transistor M8 is connected to the VDD voltage. Therefore, transistor M8 remainsturned on in operation and provides a resistive load for transistor M9 which receives the RAMP input signal. Transistor M8 is included in differential pair 302 to equalize the resistive load at both branches of the different pair (that is, at nodes 310 and 320) so that effective comparison can be performed. Because the input signal path in the first branch includes two NMOS transistors connected in series, the input signal path in the second branch also needs to have the same number of equally sized transistors. Of course, other method for equalizing the resistive load at the first and second branches of differential pair 302 can be used, such as by appropriately sizing transistor M9 or by providing a resistor in lieu of transistor M8. Furthermore, while in the embodiment shown in FIG. 7, the gate terminal of transistor M8 is shown connected to the VDD voltage, this is illustrative only and in other embodiments, the gate terminal of transistor M8 can be connected to a reference voltage other than the VDD voltage as long as the reference voltage is sufficiently high to turn the transistor on. In that case, the input select signals S0 to S3 will also rise to the same reference voltage when the respective signal is to be turned on (i.e., at a logic high level).

The output signal of differential pair 302 (node 320) is coupled to inverter 304 for inversion and amplification. Specifically, inverter 304 includes an NMOS transistor 324 having it gate terminal coupled to the Bias voltage signal and a PMOS transistor 322 having it gate terminal coupled to the output signal of differential pair 302 (node 320). The output signal (node 326) of inverter 304 is a digital value representative of the analog signal being digitized.

The novel multiplexing scheme of the present invention involving incorporating multiplexer 108 in the input signal paths of comparator 101 provides several advantages. First, by avoiding placing a switching transistor in series with the source of the analog input signals, cross-talk between the input analog signals is minimized. Second, because the multiplexing of input signal paths does not degrade signal integrity, A/D converter 100 is free to "observe" the analog input signals as long as it needs and as often as it needs. Repetitive reading of the analog signals does not destroy the signal level. Thus, when a digital pixel sensor incorporates A/D converter 100 of the present invention for pixel-level ADC, the digital image sensor can perform multiple sampling of an image while multiplexing one ADC circuit (or one input channel of the ADC circuit) between two or more pixels. Multiple sampling operation can be carried out without requiring resetting of the analog input signals at each sampling. Third, since A/D converter 100 implements the MCBS ADC technique which is a bit-serial ADC, each bit of the N-bit digital code representative of the analog signal is converted and outputted independently of the other bits. The multiplexing scheme of the present invention provides flexibility in the analog-to-digital conversion process. Thus, when the multiplexing scheme in comparator 101 of FIG. 7 is used, it is possible to interleave A/D conversion on a bit by bit basis among four analog input signals. Thus, A/D converter 100 can convert the most significant bit (MSB) of each of analog input signals In0, In1, In2 and In3 before moving on to convert the next lower order bits of the input signals. In certain applications, such an interleaving A/D conversion process may be desirable.

Figure 8:
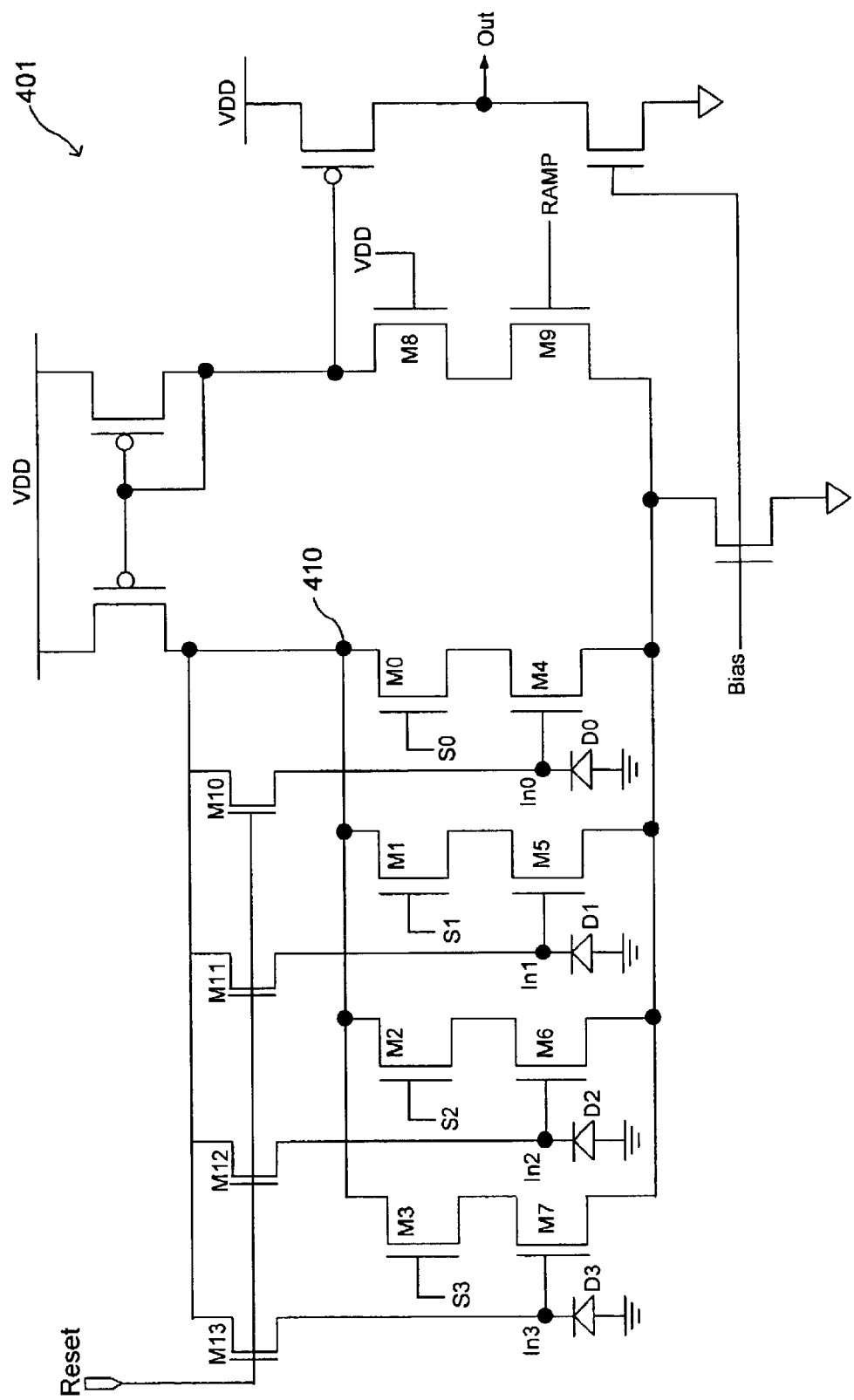
FIG. 8 is a circuit diagram illustrating another embodiment of the comparator circuit for use with the analog-to-digital converter in accordance with the present invention.

In a digital pixel sensor incorporating pixel level ADC, a reset operation is performed after an image is captured to reduce the comparator offset voltage. Analog autozeroing operation is also performed during the reset operation which has the effect of reducing fixed pattern noise and 1/f noise. In the '657 patent, the reset operation is performed by including a reset transistor which, when activated, causes the comparator to operate as an Op Amp in a unity gain feedback loop. The reset operation can be incorporated in the A/D converter of the present invention by providing a reset transistor for each input signal paths in the comparator of the A/D converter. FIG. 8 illustrates another embodiment of the comparator circuit of the present invention including reset transistors for performing reset and autozeroing operations. Comparator 401 of FIG. 8 is constructed in the similar manner as comparator 101 of FIG. 7. Here, the analog input signals of comparator 401 are shown coupled to photodiodes D0 to D3 to illustrate that comparator 401 is being applied in a digital image sensor to carry out pixel. level ADC. To incorporate the reset operation in comparator 401, NMOS transistors M10 to M13, acting as reset transistors, are included in comparator 401 and are each coupled between node 410 and the respective analog input terminals of the input signal path. Thus, transistor M10 is coupled between node 410 and the gate terminal of transistor M4 receiving analog input signal In0. Similarly, transistors M11 to M13 are coupled between node 410 and the respective gate terminals of transistors M5 to M7. In the embodiment shown in FIG. 8, reset transistors M10 to M13 are controlled by the same Reset signal generated by control circuitry external to the A/D converter. Therefore, photodiodes D0 to D3 are reset at the same time. Of course, it is possible to provide different reset signals to each of reset transistors M10 to M13 so that photodiodes D0 to D3 are individually reset.

Figure 3:
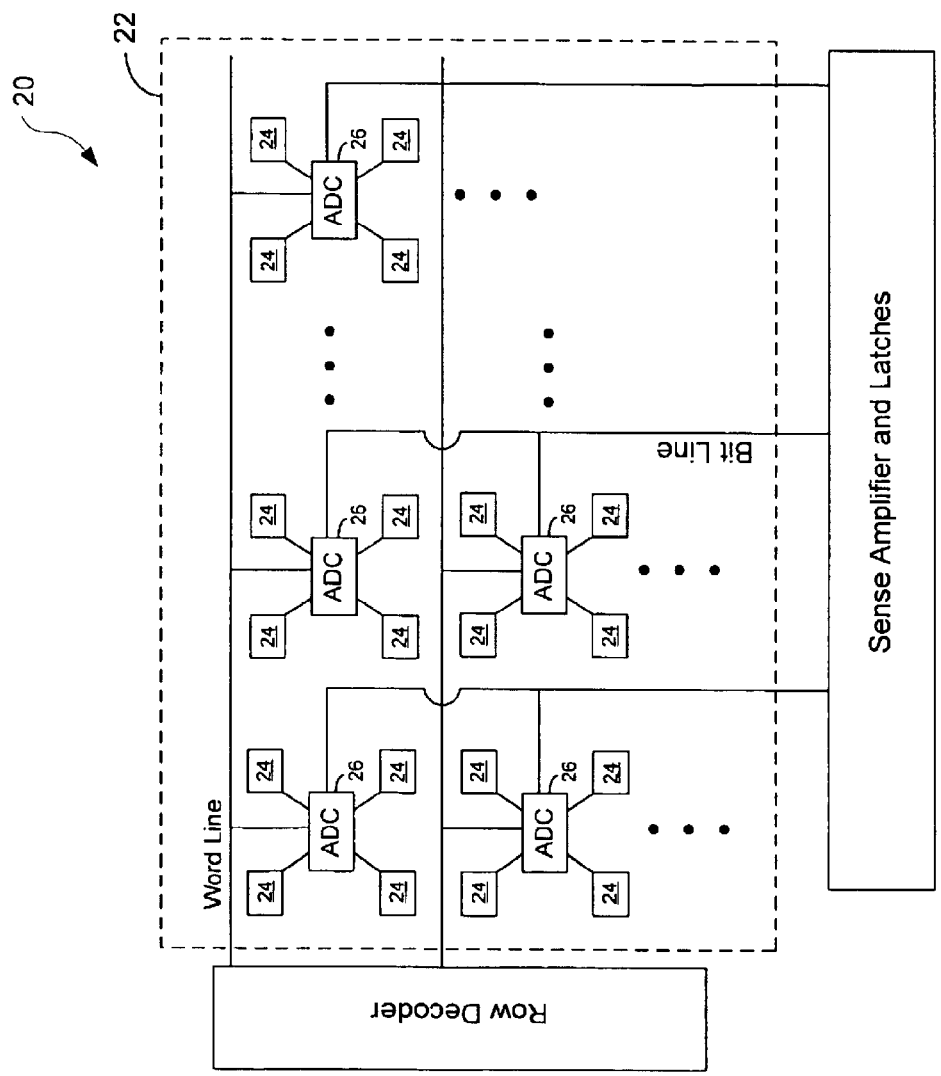
FIG. 3 is a block diagram of a digital image sensor where an A/D converter is associated with four photodetectors in an image sensor array.

According to one embodiment of the present invention, the A/D converter of the present invention is implemented in digital image sensor 20 of FIG. 3 for multiplexing between four neighboring pixel elements 24. ADC circuit 26 is replaced with A/D converter 100 of FIG. 5 incorporating the novel multiplexing scheme of the present invention. The shared-ADC architecture of FIG. 3 illustrates a configuration where four neighboring pixel elements share one ADC circuit. Of course, other pixel elements-to-ADC circuit ratios can be used depending on layout design choice and speed considerations. Digital image sensor 20 may include other control circuitry such as a clock generation circuit and other global control circuitry which are not shown in FIG. 3.

In the above description, the novel multiplexing scheme of the present invention is applied to the input signal paths of a comparator implemented using two-stage differential pair/inverter configuration. Of course, this is illustrative only and one of ordinary skill in the art would appreciate that the novel multiplexing scheme of the present invention can be applied to other comparator configurations as well. In fact, the multiplexing scheme of the present invention can be applied to multiplex the input signal paths of a variety of comparator configurations. For example, the novel multiplexing scheme of the present invention can also be applied to a comparator including a cascode stage as the first stage. In that case, the input signal paths of the cascode stage are multiplexed according to the present invention so that the comparator can be shared among a number of analog input signals.

Figure 8A:
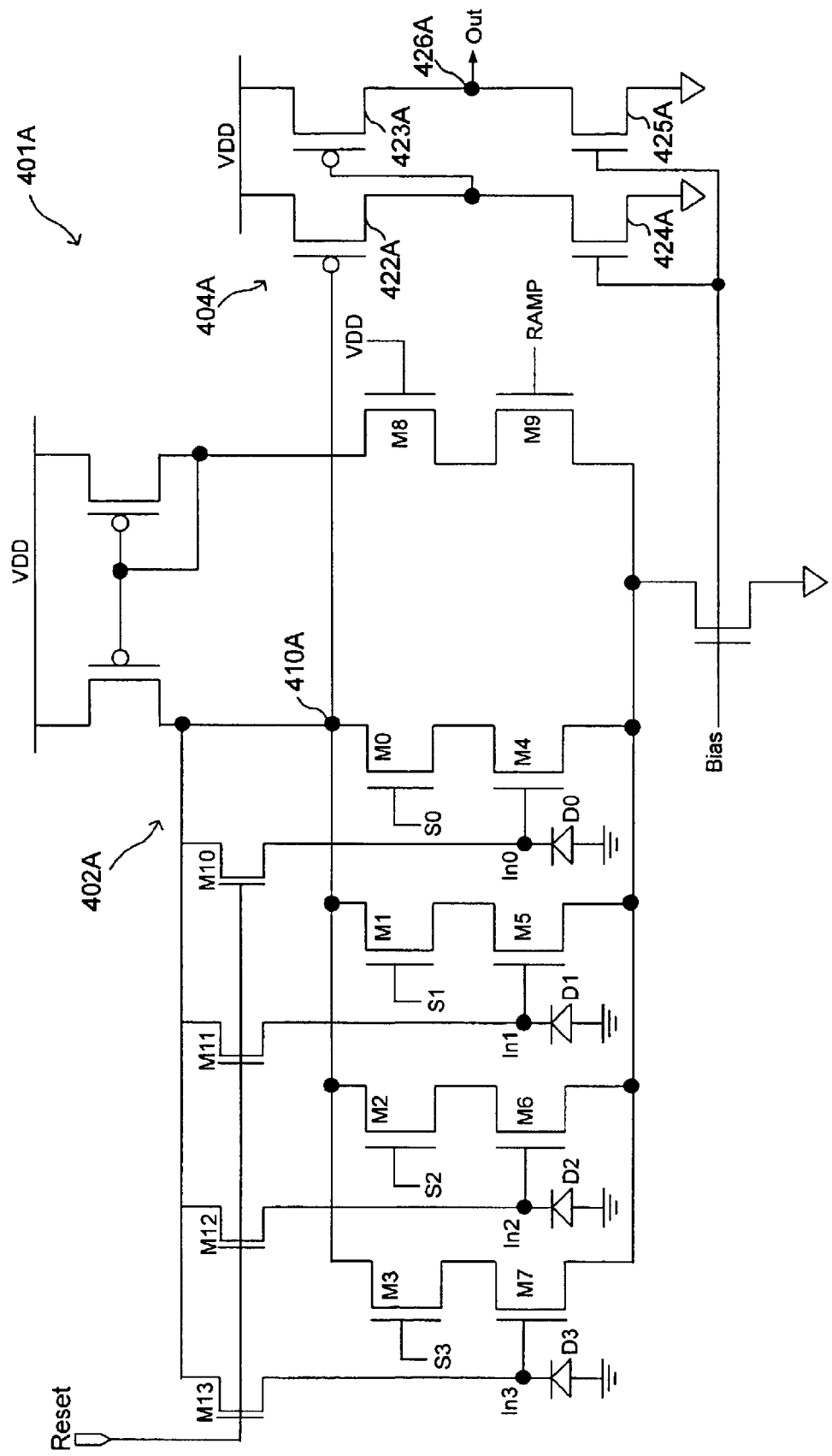
FIG. 8A is a circuit diagram illustrating an alternate embodiment of the comparator circuit of FIG. 8 for use with the analog-to-digital converter in accordance with the present invention.

FIG. 8A is a circuit diagram illustrating an alternate embodiment of comparator 401 of FIG. 8 in accordance with the present invention. Referring to FIG. 8A, comparator 401A is constructed in the same manner as comparator 401 of FIG. 8 except that the output signal of differential pair 402A is taken from the first branch (node 410A) of the differential pair. Furthermore, in FIG. 8A, the output signal of differential pair 402A is coupled to a buffer 404A which is implemented as a two-stage amplifier including PMOS transistor 422A biased by NMOS transistor 424A in the first stage and PMOS transistor 423A biased by NMOS transistor 425A in the second stage. Transistors 424A and 425A are driven by the Bias voltage signal. Buffer 404A in comparator 401A is used to provide buffering or amplification of the output signal from differential pair 402A. Buffer 404A can provide a gain of one or more. In FIG. 8A, buffer 424A includes two amplification stages. In other embodiments, multiple amplification stages may be used depending on the amount of desired signal gain. Buffer 404A can be implemented as an inverting buffer or a non-inverting buffer depending on design choice. For instance, the output signal "Out" on node 426A is coupled to subsequent circuitry (such as latches and sense amplifiers) which may provide further inversion of the signal polarity. Therefore, buffer 404A can be implemented as an inverting or non-inverting buffer depending on the desired final signal polarity and the number of inversion stages which follows.

Figure 9:
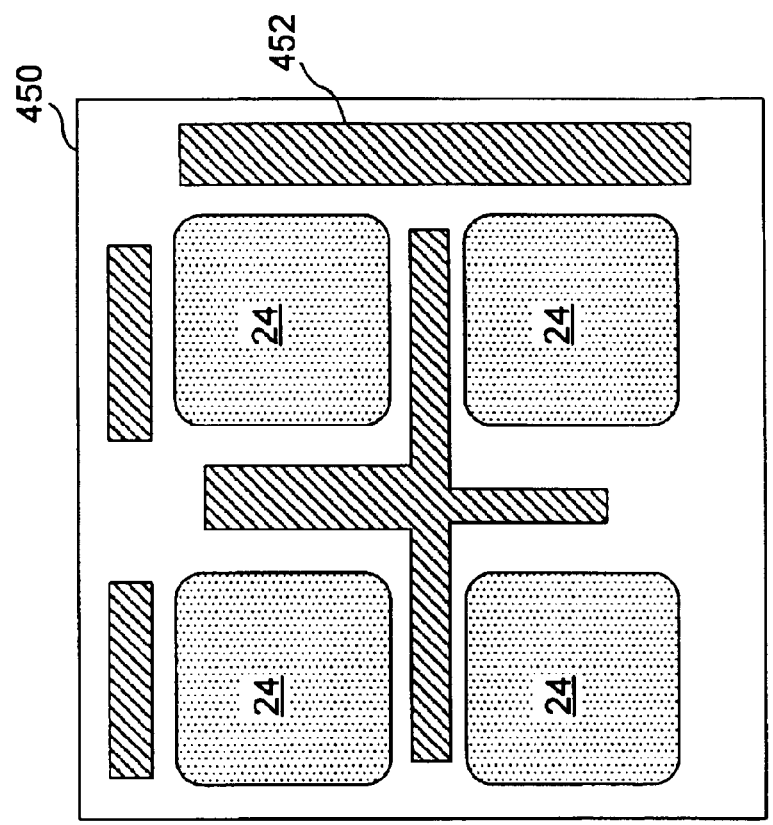
FIG. 9 is a representative layout plot of four pixels in a digital image sensor implementing the shared-ADC scheme using the multiplexed multi-channel bit serial analog-to-digital converter of FIG. 5 and the comparator circuit of FIG. 8.

When a digital image sensor implements a shared-ADC architecture, such as that illustrated in FIG. 3, where a group of neighboring photodetectors share one analog-to-digital converter (ADC), the circuitry for the analog-to-digital converter is usually distributed in the area surrounding the group of photodetectors in a manner so as to optimize the electrical distance between each photodetector and the ADC input circuitry and also to optimize the overall size of the image sensor. FIG. 9 is a representative layout plot of four pixels in a digital image sensor implementing the shared-ADC scheme using the multiplexed multi-channel bit serial analog-to-digital converter of FIG. 5 and the comparator circuit of FIG. 8. Referring to FIG. 9, photodetectors 24 are arranged in a two-dimensional array for detecting incident light. Blocks 452 represent the ADC circuitries that are associated with the four neighboring photodetectors 24.

A digital image sensor implementing the multiplexed multi-channel bit serial analog-to-digital converter of the present invention using the comparator circuit of FIG. 8 can achieve a very small pixel area (e.g. 5–6 μm) and a very small number of transistors per pixel (e.g. 6–9 transistors per pixel). However, the resultant layout of the ADC circuitry is often non-symmetrical with respect to the photodetectors, as illustrated in FIG. 9. This is because the comparator circuit of FIG. 8 includes multiple input signal paths forming the first branch of the differential pair of the comparator but only one "signal path" for the second branch of the differential pair. The non-symmetrical placement of the ADC circuitry around the photodetectors can sometimes affect the optical and electrical characteristics of the photodetectors. In some application, it may be desirable to provide symmetry in the layout of the ADC circuit around the multiplexed photodetectors.

Figure 11:
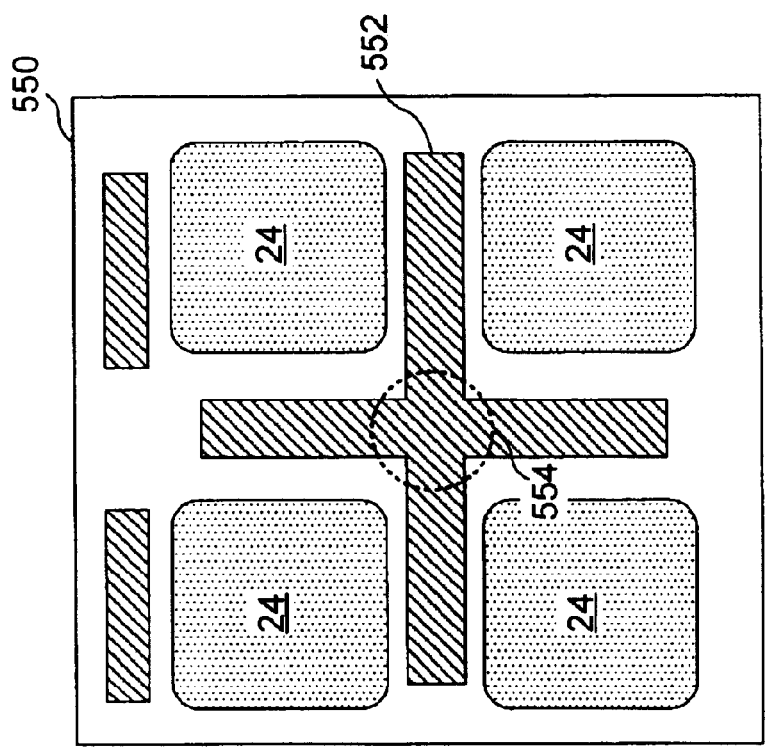
FIG. 11 is a representative layout plot of four pixels in a digital image sensor implementing the shared-ADC scheme using the multiplexed multi-channel bit serial analog-to-digital converter of FIG. 5 and the comparator circuit of FIG. 10.
Figure 10:
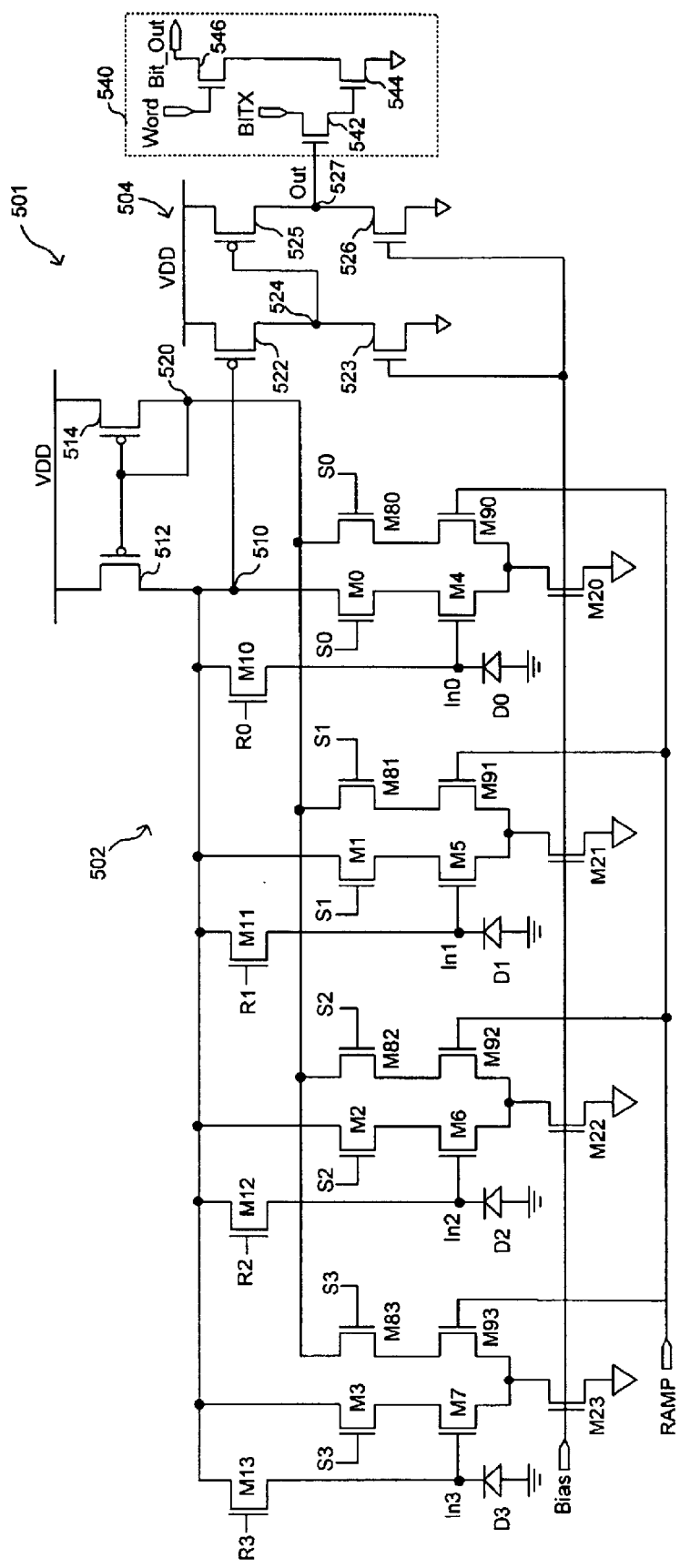
FIG. 10 is a circuit diagram illustrating another embodiment of the comparator circuit incorporated in an analog-to-digital converter in accordance with the present invention.

According to another aspect of the present invention, a multiplexed multi-channel bit serial (MCBS) analog-to-digital converter (A/D converter) includes a comparator incorporating a full differential pair for each analog input signal coupled to the ADC. FIG. 10 is a circuit diagram illustrating a comparator circuit including four full differential pairs for the analog input signals In0–3 for use with the multiplexed MCBS A/D converter of FIG. 5 according to one embodiment of the present invention. Specifically, comparator 501 can be incorporated in A/D converter 100 of FIG. 5 to multiplex between a multiple number of analog input signals for performing analog-to-digital conversion of the analog input signals. When A/D converter 100 incorporating comparator 501 is applied in a digital image sensor for multiplexing between multiple neighboring photodetectors, the layout of the ADC circuit can be made to be symmetrical about the multiplexed photodetectors, as illustrated in FIG. 11 and will be described in more detail below.

Referring to FIG. 10, comparator 501 includes two stages. The first stage of comparator 501 includes a group of four multiplexed differential pairs 502 coupled to a current mirror formed by PMOS transistors 512 and 514. The differential pairs are biased by bias transistors M20 to M23. The second stage of comparator 501 includes a buffer 504 for buffering or amplifying the output signal from the differential pairs and generating an output signal "Out" for comparator 501. Buffer 504 can have a gain of one or more. When comparator 501 is incorporated in A/D converter 100 (FIG. 5), the output signal Out of comparator 501 is coupled to a latch for generating an N-bit digital code indicative of the analog input values being digitized. In FIG. 10, the output signal Out is coupled to a latch 540 implemented using NMOS transistors 542, 544 and 546, as will be described in more detail below.

In the present embodiment, comparator 501 receives four analog input signals In0–3 which in FIG. 10 are represented as the light intensity values detected by the respective photodiodes D0 to D3. Of course, this is illustrative only and comparator 501 may receive analog input signals from any source. In comparator 501, each of analog input signals In0–3 is coupled to a full differential pair including a first circuit branch and a second circuit branch. The select signals S0 to S3 are coupled to both the first circuit branch and the second circuit branch of the respective differential pair to enable one of the differential pairs at any one time. In this manner, comparator 501 multiplexes between the analog input signals In0–3 and selects one of the differential pairs to perform the comparison of the selected analog input signal with the RAMP signal at the selected differential pair.

Each differential pair in comparator 501 includes a first transistor in the first circuit branch (transistors M4 to M7) for receiving the analog input signals In0–3 and a second transistor in the second circuit branch (transistors M90 to M93) for receiving the RAMP signal to be compared with the respective analog input signal. Each of the differential pairs is biased by a respective one of bias transistors M20 to M23. The bias transistors M20–M23 are controlled by a Bias voltage signal. The multiplexor function of comparator 501 is realized by transistors M0 to M3 in the first circuit branch of each of the differential pair and by transistors M80 to M83 in the second circuit branch of each of the differential pair. By including multiplexing transistors M0–M3 and M80–M83 in both the first and second branches of the differential pairs, the differential pairs that are not selected will be turned off completely and do not interfere with the operation of the selected differential pair.

Specifically, select signal S0 for selecting input signal In0 is coupled to transistors M0 and M80. Thus, when select signal S0 is asserted, the differential pair formed by transistors M4 and M90 are enabled and input signal In0 is compared with the RAMP signal. In operation, at any one time, only one of input select signals S0–S3 is asserted (at a logic high level) for turning on a pair of transistors M0–M3 and M80–M83 so as to enable the respective differential pair. When a differential pair is selected, that is, when a pair of multiplexing transistors M0–M3 and M80–M83 are turned on, the input signal is coupled to node 510 and the RAMP signal is coupled to node 520 for comparison. In the present embodiment, the output signal of the differential pair is taken from the first circuit branch (node 510).

In FIG. 10, comparator 501 is illustrated as including four differential pairs for multiplexing between four analog input signals. This is illustrative only and in other embodiments, comparator 501 can be configured to multiplex between any number of analog input signals by providing the corresponding number of differential pairs.

Furthermore, in the embodiment shown in FIG. 10, comparator 501 includes reset transistors M10 to M13 at each differential pair for performing reset and autozeroing operation. The reset transistors M10–M13, when activated, cause the comparator to operate as an operational amplifier in a unity gain feedback loop for offset cancellation. In comparator 501, reset transistors M10 to M13 are each coupled between node 510 and the respective analog input signals In0–3. For instance, reset transistor M10 is coupled between node 510 and the gate terminal of transistor M4 receiving the analog input signal In0. Similarly, transistors M11 to M13 are coupled between node 510 and the respective gate terminals of transistors M5–M7. In the embodiment shown in FIG. 10, reset transistors M10 to M13 are controlled by individual reset signals R0 to R3 generated by control circuitry external to the A/D converter. Therefore, photodiodes D0 to D3 are individually reset. Of course, it is possible to provide the same reset signal to reset transistors M10 to M13 so that photodiodes D0 to D3 are reset at the same time.

Note that reset transistors M10 to M13 are not required for the operation of the comparator and comparator 501 may be implemented without the reset transistors. However, when comparator 501 is incorporated in an A/D converter for use in a digital image sensor, reset transistors are typically included for the purpose of resetting the photodiodes between each image capture. When the A/D converter of the present invention is used in other applications, resetting of the analog input signal source may not be needed. Inclusion of the reset transistors in the comparator circuit of the present invention is therefore optional and depends on the application in which the comparator circuit is incorporated.

The output signal of differential pairs 502 (node 510) is coupled to buffer 504 for buffering or amplification. In the present embodiment, buffer 504 includes two amplification stages implemented as two serially connected inverters. The first amplification stage includes a PMOS transistor 522 driven by the output signal on node 510 from the selected one of differential pairs 502. PMOS transistor 522 is biased by an NMOS transistor 523 driven by the Bias voltage signal. The second amplification stage includes a PMOS transistor 525 driven by the output signal (node 524) of the first amplification stage. PMOS transistor 525 is biased by an NMOS transistor 526 driven by the Bias voltage signal. The output signal "Out" (node 527) is a digital value representative of the selected analog signal being digitized.

In the present embodiment, buffer 504 is implemented as a non-inverting buffer including two amplification stages. In other embodiments, multiple amplification stages may be used depending on the amount of desired signal gain. Also, buffer 504 can be implemented as an inverting buffer or a non-inverting buffer depending on design choice. For instance, the output signal "Out" on node 527 is coupled to subsequent circuitry (such latches and sense amplifiers) which may provide further inversion of the signal polarity. The use of a non-inverting buffer of two amplification stages in the present embodiment is illustrative only.

When comparator 501 is coupled for use in an MCBS A/D converter, the output signal Out of comparator 501 is coupled to a latch 540 for generating an N-bit digital code representative of the analog input signal being digitized. In the present embodiment, latch 540 includes NMOS transistor 542 driven by the output signal Out (node 527). The drain terminal of transistor 542 is coupled to receive a BITX signal. Depending on the value of output signal Out, the BITX signal at the drain terminal of transistor 542 is either passed to the source terminal of the transistor or barred from passing. The source terminal of transistor 542 is coupled to drive NMOS transistor 544. The drain terminal of NMOS transistor 544 is coupled to a pass gate implemented as NMOS transistor 546. Specifically, pass gate 546, controlled by a Word line signal, determines when the signal on the drain terminal of transistor 544 is to be passed to the output node as output signal Bit_Out. The output signal Bit_Out is an N-bit digital code and denotes the Outx output signal of latch 17 in FIG. 5.

In the present embodiment, pass gate 546 is included in latch 540 because the A/D converter formed by comparator 501 and latch 540 is typically formed in an array for digitizing a large number of analog signals. Thus, each A/D converter in the array includes a pass gate in the latch circuit for controlling the column readout so that only one Bit_Out signal from one A/D converter is being coupled to the array output, such as the bitline, at a time. Of course, the A/D converters can be arranged in a two-dimensional array whereby the pass gates in a row of A/D converters are enabled to output the respective Bit_Out signals onto the respective bitline.

When an MCBS A/D converter incorporating the comparator circuit of FIG. 10 is applied in a digital image sensor for implementing pixel level A/D conversion, the A/D converter provides additional benefits over A/D converters implemented using the comparator circuits of FIGS. 7 and 8, even though the advantages are obtained at the expense of larger pixel area (e.g. 7–8 μm) and larger transistor count per pixel (e.g. 8–9 transistors/pixel). Importantly, the A/D converter incorporating the comparator circuit of FIG. 10 promotes a symmetrical layout so that the multiplexed pixels associated with the A/D converter can be formed in a fully symmetrical fashion. FIG. 11 is a representative layout plot of four pixels in a digital image sensor implementing the shared-ADC scheme using the multiplexed multi-channel bit serial analog-to-digital converter of FIG. 5 and the comparator circuit of FIG. 10. As illustrated in FIG. 11, when a full differential pair is provided for each analog input signal (that is, each photodetector 24), the ADC circuitry can be distributed in a symmetrical manner about the associated photodetectors, promoting a fully symmetrical pixel layout. The advantages in realizing a symmetrical pixel layout are numerous. In particular, a symmetrical layout enhances matching of the optical and electrical characteristics between pixels.

With respect to the electrical characteristics of the digital image sensor, providing a full differential pair for each analog input signal in the comparator of the A/D converter can realize significant noise reduction. First, the offset voltage in the differential pair is lowered as each differential pair has a well matched first and second circuit branches. Second, by turning off the differential pairs when not selected, 1/f noise associated with trapped charges in field effect transistors can be reduced. Third, because the two branches of each differential pair can be placed physically close to each other, injected noise causing differential substrate voltage is substantially reduced.

Importantly, by providing a full differential pair at each analog input signal, each circuit branch of the differential pair experiences the same common mode noise which is cancelled out by the differential operation. In the comparator layout where the analog input signals share one branch of the differential pair, the first and second branches of the differential are often placed far apart from each other. The separated first and second circuit branches may experience different noise pickup from the substrate, which difference in nose pickup cannot be cancelled out by the differential operation.

Also, when the pixels are formed in a symmetrical fashion as in FIG. 11, each pixel and associated circuitry can have uniform substrate interaction and uniform parasitic interaction, such as parasitic capacitance with conductive lines crossing over the analog circuitry. As a result, the electrical characteristics of the pixels in the image sensor can be better matched.

Lastly, in the symmetrical layout of FIG. 11, noisy signals, such as the BITX signal, can be placed in a common centroid (denoted by a dotted circle 554) as far from each photodiode as possible. In this manner, impact from the noise signal can be minimized and any impact will be experienced by each multiplexed pixel in the same amount to ensure matched electrical characteristics.

With respect to optical characteristics, optical symmetry of the pixels is promoted by the use of a symmetrical pixel layout. Therefore, the optical characteristics of the photodetectors in an array can better match. The digital image sensor of the present invention incorporating the comparator circuit of FIG. 10 can realize improved light detection capability and improved image quality.

In the above embodiments, a multiplexed multi-channel bit serial (MCBS) A/D converter is described. According to another aspect of the present invention, the multiplexed A/D converter can implement A/D conversion using other analog-to-digital conversion schemes. In one embodiment, the multiplexed A/D converter of the present invention implements a thermometer-code analog-to-digital conversion technique with continuous sampling of the input signal for achieving a digital conversion with a high dynamic range. A massively parallel thermometer-code analog-to-digital conversion scheme is described in copending and commonly assigned U.S. patent application Ser. No. 10/185, 584, entitled "Digital Image Capture having an Ultra-high Dynamic Range," of Justin Reyneri et al., filed Jun. 26, 2002, which patent application is incorporated herein by reference in its entirety.

Figure 12:
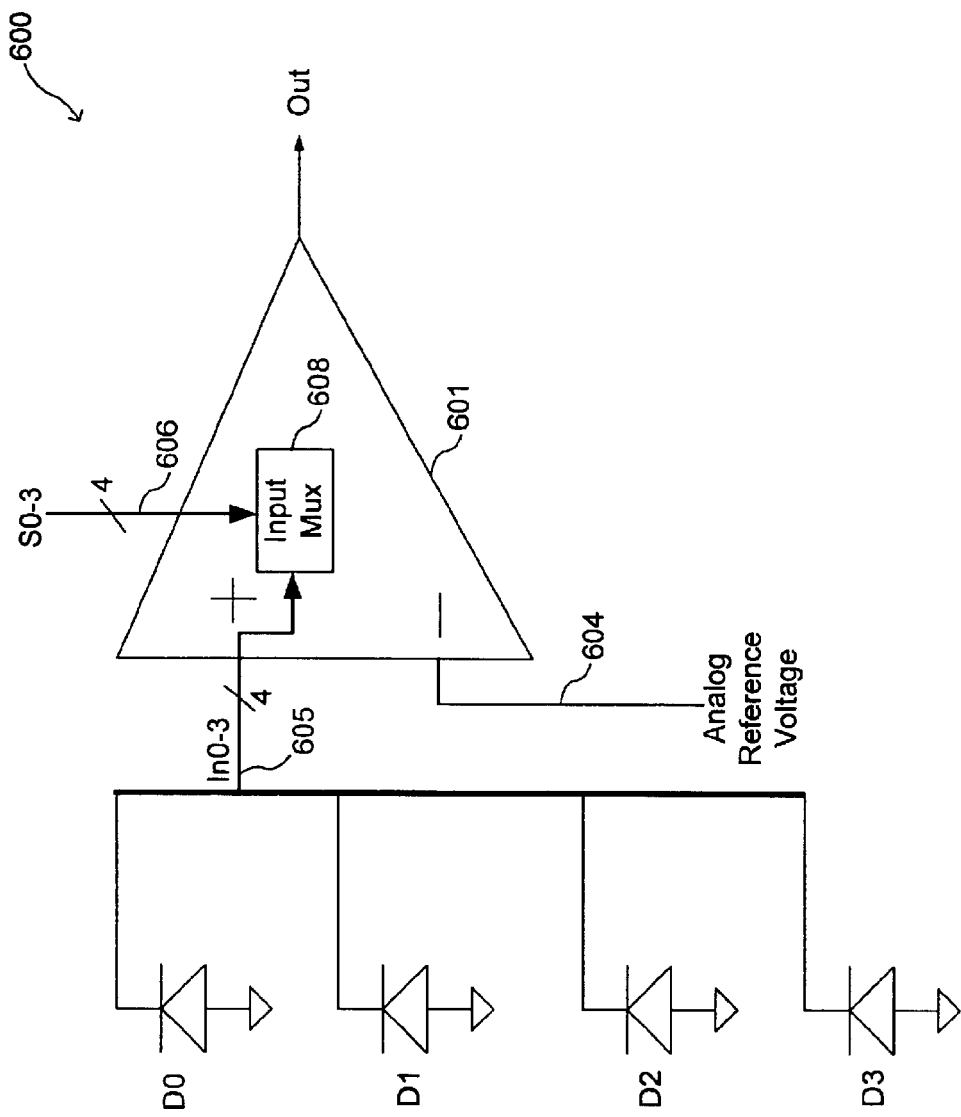
FIG. 12 is a block diagram of a multiplexed A/D converter according to one embodiment of the present invention.

FIG. 12 is a block diagram of a multiplexed A/D converter according to one embodiment of the present invention. Referring to FIG. 12, A/D converter 600 includes a comparator 601 for multiplexing between a multiple number of analog input signals. In the present embodiment, analog input signals In0 to In3 are coupled to the positive input terminal 605 of comparator 601. The negative input terminal 604 of comparator 601 receives an analog reference voltage as input to be compared with a selected one of the analog input signals. An input multiplexor 608 (or multiplexer 608) operates to multiplex between analog input signals In0–3 while preventing cross-talk between the analog input signals. Select signals S0 to S3 on select input terminal 606 operates to control input multiplexor 608 for selecting one of the four analog input signals In0 to In3.

In the MCBS A/D conversion scheme, a latch is used at the output of the comparator to pass the BITX value as the digital code output. When A/D converter 600 implements the thermometer-code analog-to-digital conversion scheme or other A/D conversions schemes, the latch circuit of FIG. 5 is not required. Instead, the output signal Out of comparator 601 represents the digital code of the selected analog signal to be digitized and can be used directly as the output signal of the A/D converter. In the present embodiment, A/D converter 600 implements the thermometer-code analog-to-digital conversion scheme. Thus, the analog reference signal on terminal 604 is a voltage that is inversely proportional to a digital count value which digital count value is a decreasing ramp signal and decrements at each sampling interval of an image capture.

Figure 13:
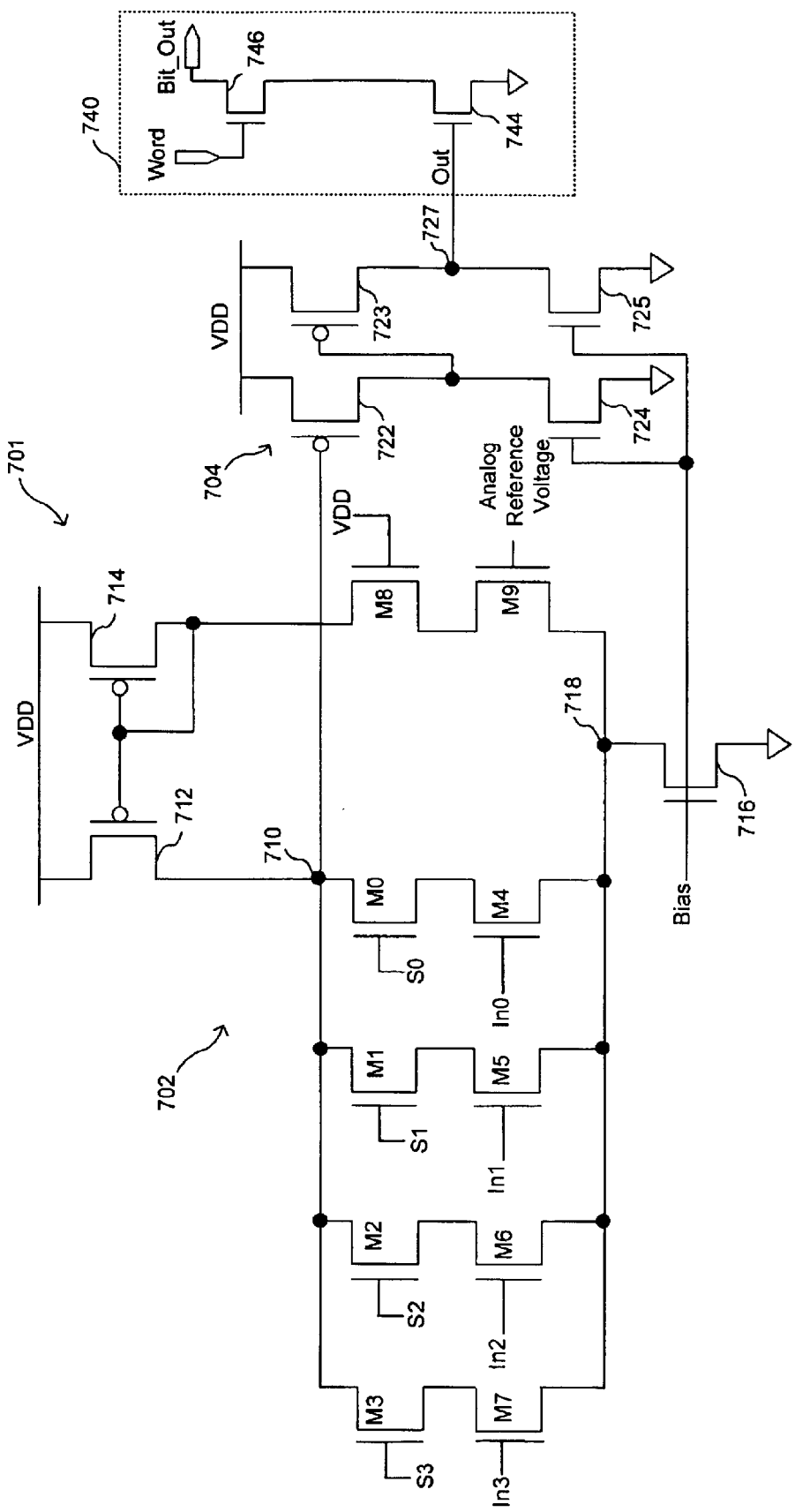
FIG. 13 is a circuit diagram illustrating a comparator circuit which can be used to implement the A/D converter of FIG. 12 according to one embodiment of the present invention.

FIG. 13 is a circuit diagram illustrating a comparator circuit which can be used to implement the A/D converter of FIG. 12 according to one embodiment of the present invention. Referring to FIG. 13, comparator 701 includes a first stage formed by a differential pair 702 and a second stage including a buffer 704. Comparator 701 is constructed in the same manner as comparator 101 of FIG. 7 except that the output signal of differential pair 702 is taken from the first branch (node 710) of the differential pair. Furthermore, in FIG. 13, the output signal of differential pair 702 is coupled to buffer 704 which is implemented as a two-stage amplifier including PMOS transistor 722 biased by NMOS transistor 724 in the first stage and PMOS transistor 723 biased by NMOS transistor 725 in the second stage. Transistors 724 and 725A are driven by the Bias voltage signal. Buffer 704 in comparator 701 is used to provide buffering or amplification of the output signal from differential pair 702. Buffer 704 can have a gain or one or more. In FIG. 13, buffer 424A includes two amplification stages. As described above, buffer 704 can be an inverting buffer or non-inverting depending on the design choice. The use of a non-inverting buffer 704 in comparator 701 is illustrative only.

In the present illustration, comparator 701 is to be incorporated in a multiplexed A/D converter using either the thermometer code ADC scheme or other ADC schemes. Therefore, the output signal Out of comparator 701 (on node 727) is not coupled to a latch but rather is coupled to an output stage 740. Output stage 740 is included because the A/D converter formed by comparator 701 is typically formed in an array for digitizing a large number of analog signals. Thus, each A/D converter in the array includes an output stage for controlling the column readout of the output signal Out. In operation, only one Bit_Out signal from one A/D converter should be coupled to the array output, such as the bitline, at a time. When the A/D converters can be arranged in a two-dimensional array, the output stage of a row of A/D converters will be enabled to output the respective Bit_Out signals onto the respective bitline.

In the present illustration, the output signal Out from comparator 701 is coupled to drive an NMOS transistor 744. The drain terminal of NMOS transistor 744 is coupled to a pass gate implemented as an NMOS transistor 746. Specifically, pass gate 746, controlled by a Word line signal, determines when the signal on the drain terminal of transistor 744 is to be passed to the output node as output signal Bit_Out. The output signal Bit_Out is an N-bit digital code generated as a result of the analog-to-digital conversion of the selected analog input signal by comparator 701. In this manner, FIG. 13 illustrates the use of comparator 701 of the present invention in a multiplexed A/D converter for any analog-to-digital conversion schemes.

Figure 14:
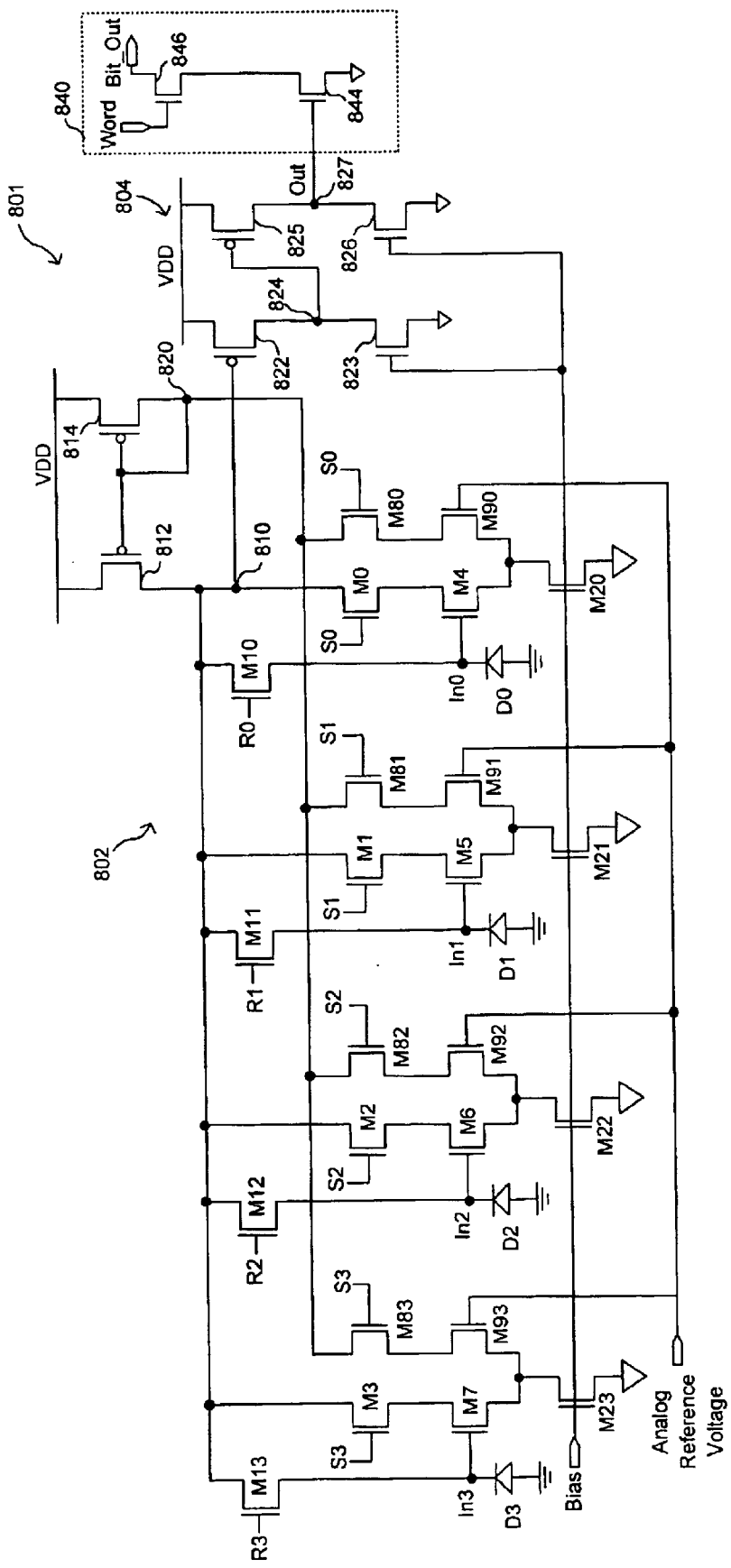
FIG. 14 is a circuit diagram illustrating a comparator circuit which can be used to implement the A/D converter of FIG. 12 according to another embodiment of the present invention.

FIG. 14 is a circuit diagram illustrating a comparator circuit which can be used to implement the A/D converter of FIG. 12 according to another embodiment of the present invention. Specifically, the comparator circuit in FIG. 14 includes four full differential pairs for the analog input signals In0–3 for promoting a symmetrical layout of the multiplexed pixels associated with the A/D converter. Referring to FIG. 14, comparator 801 is constructed in the same manner as comparator 501 of FIG. 10. However, in the present illustration, comparator 801 can be incorporated in a multiplexed A/D converter using A/D conversion schemes other than MCBS. Thus, comparator 801 is coupled to an output stage 840 only without any intermediate latch circuit.

Referring to FIG. 14, the output signal Out from comparator 801 (no node 827) is coupled to drive an NMOS transistor 844. The drain terminal of NMOS transistor 844 is coupled to a pass gate implemented as an NMOS transistor 846. Specifically, pass gate 846, controlled by a Word line signal, determines when the signal on the drain terminal of transistor 844 is to be passed to the output node as output signal Bit_out. The output signal Bit_Out is an N-bit digital code generated as a result of the analog-to-digital conversion of the selected analog input signal by comparator 801. In this manner, FIG. 14 illustrates the use of comparator 801 of the present invention in a multiplexed A/D converter applying any analog-to-digital conversion schemes.

The above detailed descriptions are provided to illustrate specific embodiments of the present invention and are not intended to be limiting. Numerous modifications and variations within the scope of the present invention are possible. For example, while the comparators in FIGS. 7, 8 and 10 are implemented using MOS transistors. Other transistor devices can be used as understood by one of ordinary skill in the art. Furthermore, the comparators of FIGS. 7, 8 and 10 can be implemented using the opposite type of MOS transistors (that is, PMOS transistors in place of NMOS transistors and vice versa) with the corresponding change in the polarity of the bias and control voltages as understood by one of ordinary skill in the art. The present invention is defined by the appended claims.

We claim:

1. An analog-to-digital (A/D) converter circuit for converting each of a plurality of analog input signals to a plurality of corresponding digital values, comprising:

a comparator having a first input terminal coupled to receive a first signal having a plurality of levels, a second input terminal coupled to receive a plurality of analog input signals, and a third input terminal for receiving a plurality of input select signals, said comparator comprising a multiplexor coupled to a plurality of differential pairs, each differential pair coupled to a respective one of said plurality of analog input signals, said multiplexor selecting one of said plurality of differential pairs based on said plurality of input select signals; and a latch having a first input terminal coupled to receive an output signal of said comparator, said latch having a data input terminal coupled to receive a series of binary signals, an output signal of said comparator controlling when said latch provides an output signal corresponding to a binary signal applied to said data input terminal, wherein said comparator compares said first signal with a selected one of said plurality of analog input signals to generate said output signal, and said latch provides one or more bits of an N-bit digital code representing said selected one of said plurality of analog input signals.

2. The circuit of claim 1 wherein said N-bit digital code comprises one of a Gray code or a thermometer code.

3. The circuit of claim 1, further comprising:

a first signal generator generating a series of binary codes representing analog levels, said first signal generator further comprising a digital-to-analog converter coupled to receive said binary codes and to generate said first signal being coupled to said first input terminal of said comparator.

4. The circuit of claim 1 wherein said first signal is an analog ramped signal for each bit of said N-bit digital code.

5. The circuit of claim 1 wherein said comparator further comprises a current mirror having a first current handling terminal coupled to a first node and a second current handling terminal coupled to a second node, and wherein each of said plurality of differential pairs in said comparator comprises:

a first transistor having a control terminal coupled to receive a respective one of said plurality of analog input signals, a first current handling terminal, and a second current handling terminal coupled to a current source;

a second transistor having a control terminal coupled to receive said first signal, a first current handling terminal, and a second current handling terminal coupled to said current source;

a third transistor having a control terminal coupled to receive a respective one of said plurality of input select signals, a first current handling terminal coupled to said first node, and a second current handling terminal coupled to said first current handling terminal of said first transistor; and a fourth transistor having a control terminal coupled to receive said respective one of said plurality of input select signals, a first current handling terminal coupled to said second node, and a second current handling terminal coupled to said first current handling terminal of said second transistor, wherein said plurality of input select signals selectively enable one of said plurality of differential pairs.

6. The circuit of claim 5, wherein said comparator further comprises a buffer having an input terminal coupled to said first node for amplifying said output signal of said comparator.

7. The circuit of claim 6, wherein said buffer comprises a plurality of amplification stages.

8. The circuit of claim 5, wherein said comparator further comprises:

a plurality of reset transistors, each of said reset transistors having a control terminal coupled to receive a reset signal, a first current handling terminal coupled to said first node, and a second current handling terminal coupled to said control terminal of said first transistor of a respective one of said plurality of differential pairs.

9. The circuit of claim 8, wherein said reset signal comprises a plurality of reset signals, and each of said control terminals of said plurality of reset transistors is coupled to a respective one of said plurality of reset signals.

10. The circuit of claim 1, further comprising:

an image sensor formed as an integrated circuit having a plurality of photodetectors, said photodetectors formed within an image sensor array, each of said photodetectors generating an analog signal, wherein said comparator is one of a plurality of comparators and said latch is one of a plurality of latches all formed within said image sensor array as part of a plurality of analog-to-digital converters, and wherein one comparator and one latch are associated with a group of photodetectors for converting analog signals generated by said group of photodetectors into digital codes, each photodetectors in said group of photodetectors generating one of said plurality of analog input signals.

11. The circuit of claim 10, wherein said one comparator and said one latch are designed into said image sensor array in a symmetrical fashion about said group of photodetectors associated with said comparator and said latch.

12. An analog-to-digital (A/D) converter circuit for converting each of a plurality of analog input signals to a plurality of corresponding digital values, comprising:

a comparator having a first input terminal coupled to receive a first reference signal, a second input terminal coupled to receive a plurality of analog input signals, a third input terminal for receiving a plurality of input select signals, and an output terminal providing an output signal, said comparator comprising a multiplexor coupled to a plurality of differential pairs, each differential pair coupled to a respective one of said plurality of analog input signals, said multiplexor selecting one of said plurality of differential pairs based on said plurality of input select signals, wherein said comparator compares said first reference signal with a selected one of said plurality of analog input signals to generate said output signal indicative of one or more bits of an N-bit digital code representing said selected one of said plurality of analog input signals.

13. The circuit of claim 12 wherein said N-bit digital code comprises a thermometer code.

14. The circuit of claim 12 wherein said comparator further comprises a current mirror having a first current handling terminal coupled to a first node and a second current handling terminal coupled to a second node, and wherein each of said plurality of differential pairs in said comparator comprises:

a first transistor having a control terminal coupled to receive a respective one of said plurality of analog input signals, a first current handling terminal, and a second current handling terminal coupled to a current source;

a second transistor having a control terminal coupled to receive said first reference signal, a first current handling terminal, and a second current handling terminal coupled to said current source;

a third transistor having a control terminal coupled to receive a respective one of said plurality of input select signals, a first current handling terminal coupled to said first node, and a second current handling terminal coupled to said first current handling terminal of said first transistor; and a fourth transistor having a control terminal coupled to receive said respective one of said plurality of input select signals, a first current handling terminal coupled to said second node, and a second current handling terminal coupled to said first current handling terminal of said second transistor, wherein said plurality of input select signals selectively enable one of said plurality of differential pairs.

15. The circuit of claim 14, wherein said comparator further comprises a buffer having an input terminal coupled to said first node for amplifying said output signal of said comparator.

16. The circuit of claim 15, wherein said buffer comprises a plurality of amplification stages.

17. The circuit of claim 14, wherein said comparator further comprises:

a plurality of reset transistors, each of said reset transistors having a control terminal coupled to receive a reset signal, a first current handling terminal coupled to said first node, and a second current handling terminal coupled to said control terminal of said first transistor of a respective one of said plurality of differential pairs.

18. The circuit of claim 17, wherein said reset signal comprises a plurality of reset signals, and each of said control terminals of said plurality of reset transistors is coupled to a respective one of said plurality of reset signals.

19. The circuit of claim 14, wherein said current source comprises a fifth transistor having a control terminal coupled to a bias voltage, a first current handling terminal coupled to said second current handling terminal of said first transistor in a respective one of said plurality of differential pairs, and a second current handling terminal coupled to a first reference voltage, wherein said first current handling terminal provides a reference current to each of said plurality of differential pairs.

20. The circuit of claim 19, wherein said current mirror comprises a sixth transistor and a seventh transistor, control terminals of said sixth and seventh transistors being connected together and to a first current handling terminal of said seventh transistor, a first current handling terminal of said sixth transistor being coupled to said first node, said first current handling terminal of said seventh transistor being coupled to said second node, and second current handling terminals of said sixth and seventh transistors being coupled to a second reference voltage.

21. The circuit of claim 20, wherein said first, second, third, and fourth transistors comprise NMOS transistors and said sixth and seventh transistors comprise PMOS transistors.

22. The circuit of claim 21, wherein said first reference voltage comprises a first voltage and said second reference voltage comprises a second positive voltage higher than the first voltage.

23. The circuit of claim 12, further comprising:
an image sensor formed as an integrated circuit having a plurality of photodetectors, said photodetectors formed within an image sensor array, each of said photodetectors generating an analog signal,
wherein said comparator is one of a plurality of comparators formed within said image sensor array as part of a plurality of analog-to-digital converters, and wherein one comparator is associated with a group of photodetectors for converting analog signals generated by said group of photodetectors into digital codes, each photodetectors in said group of photodetectors generating one of said plurality of analog input signals.

24. The circuit of claim 23, wherein said one comparator is designed into said image sensor array in a symmetrical fashion about said group of photodetectors associated with said comparator.

25. An analog-to-digital (A/D) converter circuit comprising:
a comparator having a first input terminal coupled to receive a first signal having a plurality of levels, a second input terminal coupled to receive said plurality of analog input signals, and a third input terminal for receiving a plurality of input select signals, said comparator including a multiplexor coupling said plurality of analog input signals to a plurality of corresponding input signal paths, said multiplexor selecting one of said plurality of input signal paths based on said plurality of input select signals; and
a latch having a first input terminal coupled to receive an output signal of said comparator, said latch having a data input terminal coupled to receive a series of binary signals, an output signal of said comparator controlling when said latch provides an output signal corresponding to a binary signal applied to said data input terminal,
wherein said comparator compares said first signal with a selected one of said plurality of analog input signals to generate said output signal, and said latch provides one or more bits of an N-bit digital code representing said selected one of said plurality of analog input signals applied to said second input terminal of said comparator; and
wherein said comparator comprises a differential pair and a buffer, said buffer having an input terminal coupled to an output terminal of said differential pair and generating said output signal of said comparator, said differential pair comprising:
a first transistor having a control terminal coupled to receive said first signal, a first current handling terminal coupled to a current mirror, and a second current handling terminal coupled to a current source; and
a first node coupling said plurality of input signal paths to said current mirror, each of said plurality of input signal paths including a second transistor and a third transistor connected in series between said first node and said current source, said second transistor having a control terminal coupled to a respective one of said input select signal, and said third transistor having a control terminal coupled to a respective one of said plurality of analog input signals, said first node being said output terminal of said differential pair,
wherein said plurality of input select signals selectively enable one of said plurality of input signal paths.

26. The circuit of claim 25, wherein said buffer comprises a plurality of amplification stages.

27. The circuit of claim 25, further comprising:
a first signal generator generating a series of binary codes representing analog levels, said first signal generator comprising a digital-to-analog converter connected to receive said binary codes and to generate said first signal being connected to said first input terminal of said comparator.

28. The circuit of claim 25, further comprising:
a binary signal generator for generating said series of binary signals.

29. An analog-to-digital (A/D) converter circuit for converting each of a plurality of analog input signals to a plurality of corresponding digital values, comprising:
a comparator having a first input terminal coupled to receive a first reference signal, a second input terminal coupled to receive a plurality of analog input signals, a third input terminal for receiving a plurality of input select signals, said comparator including a multiplexor coupling said plurality of analog input signals to a plurality of corresponding input signal paths, said multiplexor selecting one of said plurality of input signal paths based on said plurality of input select signals,
wherein said comparator compares said first reference signal with a selected one of said plurality of analog input signals to generate said output signal indicative of one or more bits of an N-bit digital code representing said selected one of said plurality of analog input signals.

30. The circuit of claim 29 wherein said N-bit digital code comprises a thermometer code.

31. The circuit of claim 29 wherein said comparator comprises a differential pair and a buffer, said buffer having an input terminal coupled to an output terminal of said differential pair and generating said output signal of said comparator, said differential pair comprising:
a first transistor having a control terminal coupled to receive said first reference signal, a first current handling terminal coupled to a current mirror, and a second current handling terminal coupled to a current source; and
a first node coupling said plurality of input signal paths to said current mirror, each of said plurality of input signal paths including a second transistor and a third transistor connected in series between said first node and said current source, said second transistor having a control terminal coupled to a respective one of said input select signal, and said third transistor having a control terminal coupled to a respective one of said plurality of analog input signals, said first node being said output terminal of said differential pair, wherein said plurality of input select signals selectively enable one of said plurality of input signal paths.

32. The circuit of claim 31, wherein said buffer comprises a plurality of amplification stages.

33. A method for performing analog-to-digital conversion comprising:

receiving a first analog signal having a plurality of levels;

receiving a plurality of analog input signals each to be converted into a digital value;

coupling said plurality of analog input signals to a corresponding plurality of differential pairs in a comparator;

selecting one of said plurality of differential pairs based on a plurality of input select signals;

comparing said first analog signal to a selected analog input signal associated with said selected one of said plurality of input signal paths, and outputting a comparison result;

receiving a series of binary signals; and applying said comparison result to a first input of a latch, and applying said series of binary signals to a data input of said latch, a logic level of said comparison result controlling when said latch provides an output signal corresponding to a binary signal applied to said data input, wherein said latch provides one or more bits of an N-bit digital code representing at least one of said analog input signals.

34. A method for performing analog-to-digital conversion comprising:

receiving a first reference signal corresponding to a plurality of decrementing digital count values;

receiving a plurality of analog input signals each to be converted into a digital value;

coupling said plurality of analog input signals to a corresponding plurality of differential pairs in a comparator;

selecting one of said plurality of differential pairs based on a plurality of input select signals;

comparing said first reference signal to a selected analog input signal associated with said selected one of said plurality of input signal paths, and outputting a comparison result; and applying said comparison result to a buffer, wherein said buffer provides one or more bits of an N-bit digital code representing at least one of said analog input signals.

\* \* \* \* \*